US009244760B2

(12) United States Patent
Fujimoto et al.

(10) Patent No.: US 9,244,760 B2
(45) Date of Patent: Jan. 26, 2016

(54) DECODING APPARATUS AND DECODING METHOD

(75) Inventors: Keisuke Fujimoto, Osaka (JP); Yasumori Hino, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 393 days.

(21) Appl. No.: 13/824,152

(22) PCT Filed: Aug. 1, 2012

(86) PCT No.: PCT/JP2012/004897
§ 371 (c)(1),
(2), (4) Date: Mar. 15, 2013

(87) PCT Pub. No.: WO2013/021588
PCT Pub. Date: Feb. 14, 2013

(65) Prior Publication Data
US 2013/0173993 A1  Jul. 4, 2013

(30) Foreign Application Priority Data
Aug. 9, 2011  (JP) .................................. 2011-173918

(51) Int. Cl.
*G11C 29/00* (2006.01)
*H03M 13/00* (2006.01)
(Continued)

(52) U.S. Cl.
CPC ............ *G06F 11/10* (2013.01); *G11B 20/1833* (2013.01); *H03M 13/1111* (2013.01);
(Continued)

(58) Field of Classification Search
CPC ................ G06F 11/10; G11B 20/1833; G11B 2020/185; G11B 220/2537; H03M 13/1128; H03M 13/41
USPC ................................ 714/764, 780, 763, 794
See application file for complete search history.

(56) References Cited

U.S. PATENT DOCUMENTS 5,278,846 A * 1/1994 Okayama et al. ............. 714/755
7,069,496 B2 * 6/2006 Fujita et al. ................... 714/780
(Continued)

FOREIGN PATENT DOCUMENTS

JP  2000-242907  9/2000
JP  2002-93068   3/2002
(Continued)

OTHER PUBLICATIONS

International Search Report issued Oct. 23, 2012 in International (PCT) Application No. PCT/JP2012/004897.

*Primary Examiner* — Christine Tu
(74) *Attorney, Agent, or Firm* — Wenderoth, Lind & Ponack, L.L.P.

(57) ABSTRACT

A control device inputs reliability information on the same data block a plurality of times into a reliability storage memory. A reliability generating device generates a reliability information by performing computation processing based on a stochastic computation by using reliability information generated in the previous cycle that has been saved in the reliability storage memory and reliability information generated in the present cycle, and saves the reliability information generated in the reliability storage memory when the decoding is performed by using reliability information on the data block the same as that in the previous cycle. A column processing computation device computes a column processing output value by using the reliability information generated and saved in the reliability storage memory and a row processing output value.

12 Claims, 16 Drawing Sheets

(51) Int. Cl.
*G06F 11/10* (2006.01)
*H03M 13/11* (2006.01)
*G11B 20/18* (2006.01)
*H03M 13/41* (2006.01)

(52) U.S. Cl.
CPC ..... *H03M13/1128* (2013.01); *G11B 2020/185* (2013.01); *G11B 2220/2537* (2013.01); *H03M 13/41* (2013.01)

(56) References Cited

U.S. PATENT DOCUMENTS 8,782,496 B2 * 7/2014 Sakaue et al. ................. 714/773

| | | | |
|---|---|---|---|
| 2002/0034142 A1 | 3/2002 | Tani et al. | |
| 2003/0112669 A1 | 6/2003 | Fukushima et al. | |
| 2005/0128966 A1 | 6/2005 | Yee | |
| 2008/0168333 A1* | 7/2008 | Yamamoto et al. | 714/780 |
| 2010/0241924 A1 | 9/2010 | Nishi | |

FOREIGN PATENT DOCUMENTS

| | | |
|---|---|---|
| JP | 2003-141822 | 5/2003 |
| JP | 2006-520547 | 9/2006 |
| JP | 2007-124341 | 5/2007 |
| JP | 4006446 | 11/2007 |
| JP | 2010-219841 | 9/2010 |

* cited by examiner

DECODING APPARATUS AND DECODING METHOD

TECHNICAL FIELD

The present invention relates to a decoding apparatus and a decoding method for decoding data by using a plurality of signals with respect to a section where an error has occurred.

BACKGROUND ART

As the density level in storage devices such as magnetic disk devices and optical disk devices has been growing, a variety of techniques have been used in recent years to acquire data correctly from the signals read from the storage devices. Examples of the conventional techniques include error detection, correction processing, and retry processing by which the reproduction operation is retried when a reproduction error is detected. For example, in the retry processing performed in an optical disk device, signal quality of reproduced data is improved by changing various retry parameters such as focus offset or signal amplitude and reproducing again the error location.

Further, a method for reproducing a plurality of times the same region and calculating an arithmetic mean of the same waveform by using a memory circuit (see, for example, Patent Literature 1 and Patent Literature 2) and a majority decision method of comparing a plurality of data that have been read out and using the data with the highest occurrence frequency (see, for example, Patent Literature 3 and Patent Literature 4) have been suggested as techniques for increasing signal quality.

A LDPC (Low-Density-Parity-Check) code has recently been suggested as a powerful error correction code in satellite broadcasting standards and next-generation communication standards. In the LDPC code, by contrast with the conventional algebraic error correction codes, stochastic inference calculations are used for decoding processing, thereby making it possible to demonstrate the performance close to the Shannon limit. By using such an error correction technique, it is possible to perform error correction even with respect to reproduced signals with an extremely poor error rate. Therefore, the aforementioned error correction technique has started finding applications in a variety of fields with the object of increasing the recording density and communication capacity.

However, in a reproduction system such as uses the aforementioned error correction technique, the quality of the reproduced signals is poor. Therefore, it is very difficult to sample a plurality of reproduced signals at the same timing in each cycle. With the conventional configurations disclosed in Patent Literature 1 and Patent Literature 2, it is necessary to average a plurality of reproduced signals and therefore a plurality of reproductions should be performed accurately at the same timing. However, when the quality of the reproduced signals is poor, the signals are very difficult to reproduce at the same timing, and in extreme cases, a bit slip occurs in a synchronization circuit (PLL (Phase Locked Loop) circuit). The resultant problem is that a synchronization shift occurs in waveform sampling, and the reproduction performance is greatly degraded.

The occurrence of a bit slip will be explained below in a simple manner with reference to FIGS. 17 and 18. FIG. 17 shows an example of sampling data during normal operation. FIG. 18 shows an example of sampling data in the case a synchronization shift has occurred. In the optical disk recording and reproduction device described in Patent Literature 2, the digital signal obtained by converting the reproduced signal read from an optical disk into a digital value with an A/D converter is saved in a memory, and the averaging is performed by using two reproduced waveforms. As shown in FIG. 17 where the reproduced signals are acquired at an adequate sampling timing during normal operation without the occurrence of a synchronization shift, the S/N ratio can be improved by 3 dB at a maximum.

By contrast, where the synchronization shift (timing shift) occurs, as shown in FIG. 18, the averaging cannot be correctly performed by using the reproduced waveform of the first cycle and the reproduced waveform of the second cycle, and multiple reproductions degrade the error rate with respect to that obtained with a single reproduction. Furthermore, the waveform of the reproduced signal averaged when the synchronization shift is induced is entirely different from the original reproduction level. Therefore, in the signal processing system, the usual synchronization processing of reproduced signals by the synchronization pattern or the like cannot be performed and signals cannot be sent to the error correcting device at a correct timing.

In the conventional devices in which a plurality of reproductions is performed, the abovementioned problem mainly occurs due to the averaging of the reproduced signals performed before the synchronization. In a system such that uses the LDPC code, the error rate of the reproduced signals prior to error correction is high and the abovementioned problem becomes more serious.

CITATION LIST

Patent Literature

Patent Literature 1: Japanese Patent Application Publication No. 2000-242907
Patent Literature 2: Japanese Patent Publication No. 4006446
Patent Literature 3: Japanese Patent Application Publication No. 2002-93068
Patent Literature 4: Japanese Patent Application Publication No. 2003-141822

SUMMARY OF THE INVENTION

The present invention has been created to resolve the above-described problems, and it is an object thereof to provide a decoding apparatus and a decoding method that can reduce the error rate of the decoded data and increase S/N.

The decoding apparatus according to one aspect of the present invention is a decoding apparatus that receives input of data constituted by a plurality of data blocks and decodes the data on the basis of reliability information on the data encoded by a parity check matrix in the data blocks, the decoding apparatus including: a reliability generating device that generates the reliability information on the basis of the inputted data; a reliability storage memory that saves the reliability information; a row processing computation device that computes a row processing output value by performing row processing by using a column processing output value; a column processing computation device that computes the column processing output value by performing column processing by using the row processing output value and the reliability information, and a control device that inputs the reliability information on the same data block a plurality of times into the reliability storage memory, wherein the reliability generating device generates anew reliability information by performing computation processing based on a stochastic computation by using reliability information generated in a previous cycle that has been saved in the reliability storage memory and reliability information generated in the present cycle, and saves the reliability information generated anew in the reliability storage memory when the decoding is performed by using reliability information on the data block same as that in the previous cycle; and the column processing computation device computes the column processing output value by using the reliability information generated anew and saved in the reliability storage memory and the row processing output value.

With such a configuration, the reliability generating device generates the reliability information on the basis of the inputted data. The reliability storage memory saves the reliability information. The row processing computation device computes the row processing output value by performing row processing by using the column processing output value. The column processing computation device computes the column processing output value by performing column processing by using the row processing output value and reliability information. The control device inputs the reliability information on the same data block a plurality of times into the reliability storage memory. The reliability generating device generates anew reliability information by performing computation processing based on stochastic computations by using reliability information generated in the previous cycle that has been saved in the reliability storage memory and reliability information generated in the present cycle, and saves the reliability information generated anew in the reliability storage memory when the decoding is performed by using reliability information on the data block same as that in the previous cycle. The column processing computation device computes the column processing output value by using the reliability information generated anew and saved in the reliability storage memory and the row processing output value.

In accordance with the present invention, decoding is performed a plurality of times by using reliability information on the same data block with respect to data with a high error rate prior to error correction. Therefore, the error rate of the decoded data can be reduced and S/N can be increased.

Other objects, features, and advantages of the present invention will become more apparent from the following detailed description and appended drawings.

DETAILED DESCRIPTION OF THE INVENTION

The embodiments of the present invention will be described below with reference to the appended drawings. The below-described embodiments represent specific examples of the present invention and place no limitation on the technical scope of the present invention.

Embodiment 1

The decoding apparatus and decoding method according to Embodiment 1 of the present invention will be explained below in greater detail with reference to the appended drawings.

Figure 1:
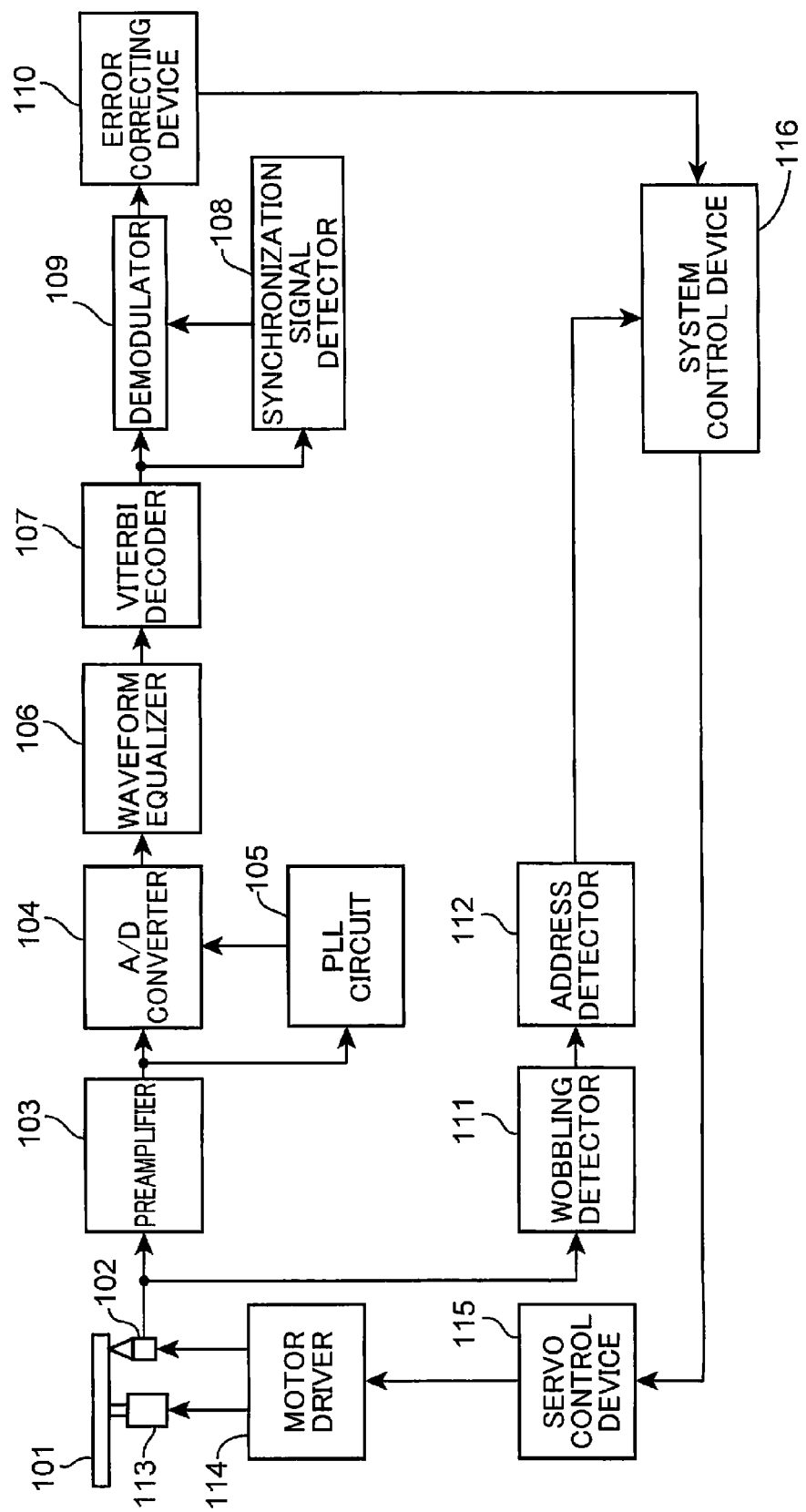
FIG. 1 shows the configuration of the optical disk device according to Embodiment 1 of the present invention.

FIG. 1 shows the configuration of an optical disk device according to Embodiment 1 of the present invention. The optical disk device shown in FIG. 1 is provided with an optical pickup 102, a preamplifier 103, an A/D converter 104, a PLL (Phase Locked Loop) circuit 105, a waveform equalizer 106, a Viterbi decoder 107, a synchronization signal detector 108, a demodulator 109, an error correcting device 110, wobbling detector 111, an address detector 112, a spindle motor 113, a motor driver 114, a servo control device 115, and a system control device 116.

The optical pickup 102 irradiates an optical disk 101 with a light beam, detects a reflected beam from the optical disk 101, and outputs a reproduction signal corresponding to the detected reflected beam. The preamplifier 103 amplifies the reproduction signal from the optical pickup 102. The A/D converter 104 samples the output from the preamplifier 103. The PLL circuit 105 supplies a clock to the A/D converter 104. The waveform equalizer 106 performs waveform shaping of the sampling data from the A/D converter 104. The Viterbi decoder 107 performs maximum likelihood decoding on the basis of the output data from the waveform equalizer 106. The synchronization signal detector 108 detects a synchronization signal from the decoding result of the Viterbi decoder 107. The demodulator 109 demodulates the decoding result on the basis of the synchronization signal. The error correcting device 110 performs error correction processing of the demodulation result.

The wobbling detector 111 detects a meandering component of the guide groove of the optical disk 101 and outputs a wobble signal. The address detector 112 detects address information from the wobble signal outputted from the wobbling detector 111. The spindle motor 113 rotates the optical disk 101. The motor driver 114 drives the spindle motor 113 and the optical pickup 102. The servo control device 115 controls the motor driver 114. The system control device 116 exchanges information with a host computer (not shown in the figure) and performs operation control and various settings for the circuits inside the optical disk device.

In the configuration shown in FIG. 1, the reproduction signal from the optical disk 101, which is the recording medium, that has been reproduced by the optical pickup 102 and the preamplifier 103 is inputted to the A/D converter 104 and converted into a digital signal. The waveform equalizer 106 performs the waveform shaping with respect to the inputted digital signal, such that the frequency characteristic of the reproducing system follows a predetermined PR equalizing method. The digital signal subjected to waveform shaping is decoded by the Viterbi decoder 107 into data with the highest likelihood.

The PLL circuit 105 generates a reproduction clock synchronized with the reproduction signal. The circuits arranged after the A/D converter 104 operate according to the reproduction clock supplied from the PLL circuit 105. The synchronization signal detector 108 detects the synchronization signal from the decoded data outputted from the Viterbi decoder 107 and outputs the timing of the synchronization signal to the demodulator 109. The demodulator 109 takes the detection timing of the synchronization signal as a reference position and demodulates the decoded data from the format of recorded pattern on the optical disk 101 into the format of recorded information. The error correcting device 110 performs error correction processing with respect to the reproduction data subjected to synchronization and demodulation.

The data are constituted by a plurality of data blocks. The decoded data subjected to the error correction processing are transferred by the system controller 116 to the host computer via an interface (not shown in the figure).

The wobbling detector 111 detects the meandering component of the guide groove of the optical disk 101 from the signal detected by the optical pickup 102. More specifically, the optical pickup 102 is provided with at least two light-receiving elements separated along the guide groove of the optical disk 101. The two light-receiving elements detect respective reflected beams from the optical disk 101. The difference signal of the two light-receiving elements is called a push-pull signal, and this signal reflects the wobbling component. Tracks for recording data in the optical disk 101 are formed in advance as pre-grooves. The side walls of the pre-grooves meander under the effect of the wobbling signal obtained by modulating the address information or the like. A wobbling address that enables recording or reproduction of data to or from a predetermined position on the optical disk 101 can be read from the wobbling information obtained as reflected beam information during recording or reproduction.

The address detector 112 detects the wobbling address from the wobbling signal detected by the wobbling detector 111 and demodulates the address data. The demodulated address data are supplied to the system control device 116. When an operation of seeking the target address is performed, the system control device 116 controls the spindle motor 113, the optical pickup 102, and an optical pickup drive unit (not shown in the figure) via the servo control device 115 and the motor driver 114 on the basis of the supplied address data. As a result, the system control device 116 moves the optical pickup 102 to the target address.

The abovementioned optical disk device reads the address data from the wobbling signal, but may also read the address information embedded in a digital signal (RF signal).

Figure 2:
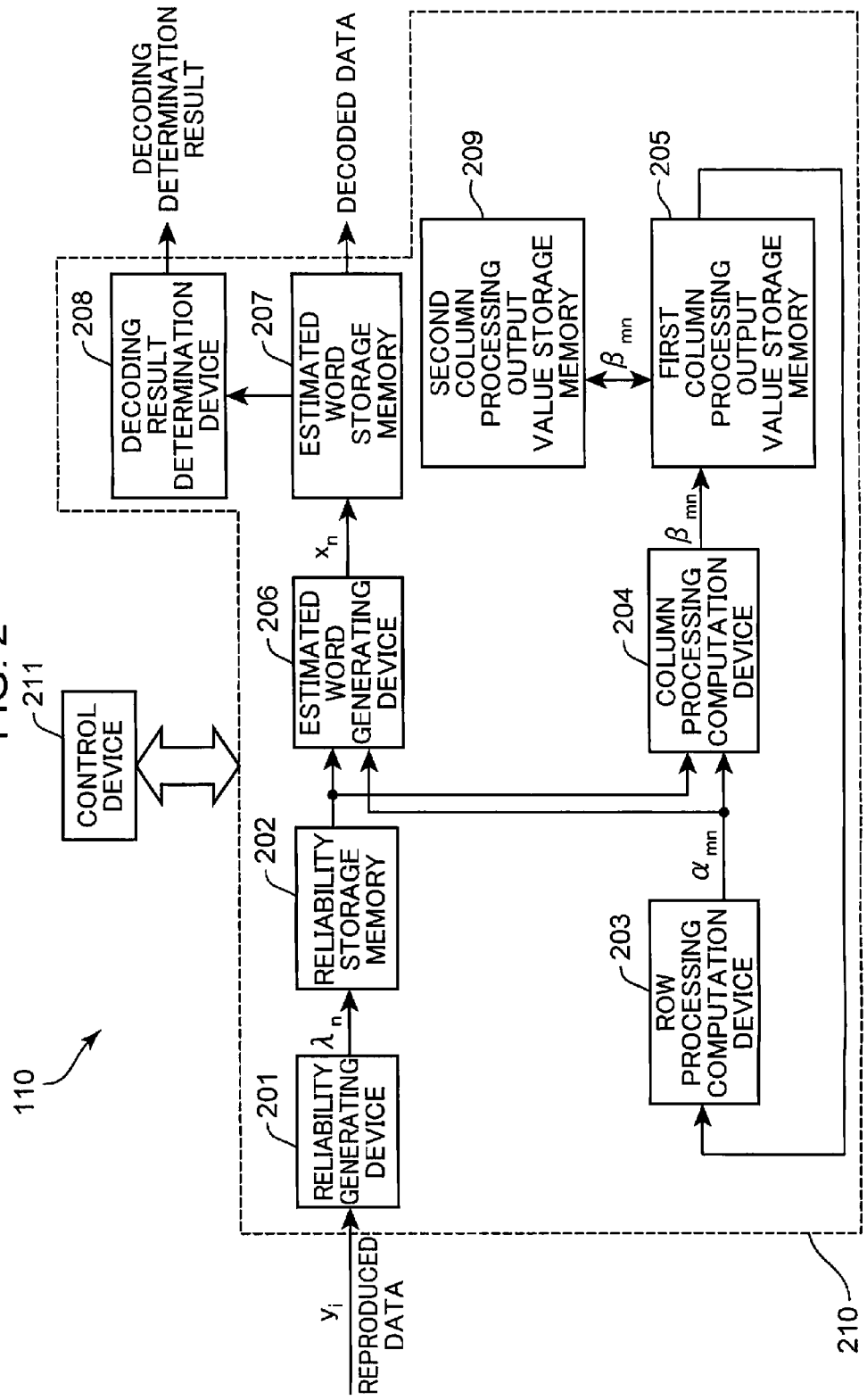
FIG. 2 shows the detailed configuration of the error correcting device according to Embodiment 1 of the present invention.

FIG. 2 shows the detailed configuration of the error correcting device 110 according to Embodiment 1 of the present invention. The error correcting device 110 receives input of data constituted by a plurality of data blocks and decodes the data on the basis of reliability information on the data encoded by a parity check matrix in the data blocks.

The error correcting device 110 is provided with a reliability generating device 201, a reliability storage memory 202, a row processing computation device 203, a column processing computation device 204, a first column processing output value storage memory 205, an estimated word generating device 206, an estimated word storage memory 207, a decoding result detection device 208, a second column processing output value storage memory 209, and a control device 211.

The reliability generating device 201 generates reliability $\lambda_n$ of reproduction data $y_i$ from the demodulator 109. The reliability storage memory 202 saves the reliability $\lambda_n$ generated by the reliability generating device 201. The row processing computation device 203 performs the row processing of the parity check matrix. The row processing computation device 203 performs the row processing by using a column processing output value to compute a row processing output value. The column processing computation device 204 performs the column processing of the parity check matrix. The column processing computation device 204 performs the column processing by using the row processing output value and reliability information to compute the column processing output value. The first column processing output value storage memory 205 saves the column processing output value $\beta_{mn}$ computed by the column processing computation device 204.

The estimated word generating device 206 generates an estimated word $x_n$ on the basis of the reliability $\lambda_n$ saved in the reliability storage memory 202 and the row processing output value $\alpha_{mn}$ computed by the row processing computation device 203. The estimated word storage memory 207 saves the estimated word $x_n$ generated by the estimated word generating device 206. The decoding result determination device 208 determines a decoding result on the basis of the estimated word $x_n$, estimated word reliability $L_n$, or column processing output value $\beta_{mn}$. In the present embodiment, the decoding result determination device 208 determines a decoding result on the basis of the estimated word $x_n$ saved in the estimated word storage memory 207.

The second column processing output value storage memory 209 saves the column processing output value $\beta_{mn}$ during cyclic reproduction processing.

The control device 211 controls various processing operations such as execution instructions and control operations for the entire system 210 constituted by a plurality of memories and a plurality of computation processing circuits. The control device 211 inputs reliability information on the same data block a plurality of times into the reliability storage memory 202. The control device 211 may be constituted by the system control device 116 shown in FIG. 1 or by a processor other than the system control device 116. In the present embodiment, each storage memory may be an external memory device separated from the computation processing circuit, or may be a storage device such as a register using a circuit element such as a flip-flop.

The second column processing output value storage memory 209 saves the column processing output value computed by the column processing computation device 204 on the basis of the reliability information inputted in the previous cycle. The row processing computation device 203 uses column processing output value of the previous cycle that have been saved in the second column processing output value storage memory 209 as initial value for the row processing when decoding is performed that uses the reliability information on the data block same as that in the previous cycle.

Further, the row processing computation device 203 repeatedly computes the row processing output value by using the column processing output value computed by the column processing computation device 204. The control device 211 monitors the number of computation processing cycles of the row processing output value obtained by the row processing computation device 203. When the number of computation processing cycles reaches a predetermined number, the control device 211 causes the reliability generating device 201 to generate the reliability information on the data block same as that in the previous cycle and inputs the generated reliability information to the reliability storage memory 202.

The control device 211 also performs the decoding processing again by using the reliability information saved in the reliability storage memory 202 with respect to the data blocks for which the determination result obtained with the decoding result determination device 208 does not fulfill the predetermined condition.

The decoding result determination device 208 may also include a parity check device that checks whether the estimated word generated on the basis of the reliability information and row processing output has been correctly decoded. In this case, the control device 211 performs again the decoding processing by using the reliability information saved in the reliability storage memory 202 with respect to the data blocks for which the check results obtained with the parity check device do not fulfill the predetermined condition.

The decoding result determination unit 208 may also determine a decoding result by comparing a computation result of any of the column processing output value, row processing output value, and estimated word reliability with a predetermined threshold. In this case, the control device 211 performs again the decoding processing by using the reliability information saved in the reliability storage memory 202 with respect to the data blocks for which the determination results obtained with the decoding result determination unit 208 do not fulfill the predetermined condition.

First, the decoding processing performed when the reproduced data $y_i$ have been inputted once into the error correcting device 110 of the present embodiment will be explained with reference to the configuration shown in FIG. 2.

The reliability generating device 201 converts the reproduced data $y_i$ outputted from the demodulator 109 into the reliability format to be handled in the error correction processing. For example, when the communication channel model is an AWGN (additive white Gaussian noise) communication channel, the reliability generating device 201 calculates the reliability $\lambda_n$ from the reproduced data $y_i$ and noise $\sigma^2$ of the communication channel, as shown in Equation (1) below.

$$\lambda_n = \frac{2y_i}{\sigma^2} \tag{1}$$

Where the reliability $\lambda_n$ is an indicator of the likelihood of the reproduced data $y_i$, the ratio of conditional probability of the communication channel may be used, or the logarithmic likelihood ratio may be used. By using the logarithmic likelihood ratio, it is possible to simplify the computation processing. The reproduced data $y_i$ may be soft determination information or hard determination information.

The reliability generating device 201 saves the generated reliability $\lambda_n$ in the reliability storage memory 202. The reliability $\lambda_n$ saved in the reliability storage memory 202 are outputted to the column processing computation device 204 and the estimated word generating device 206 when the decoding processing is performed.

The row processing computation device 203 uses the column processing output value $\beta_{mn}$ saved in the first column processing output value storage memory 205, performs the computation processing (row processing) with respect to each element of the columns of the parity check matrix according to the following Equation (2), and outputs the computation processing results as the row processing output value $\alpha_{mn}$.

$$\alpha_{mn} = \left[\prod_{n' \in A(m)\backslash n} \mathrm{sign}(\beta_{mn'})\right] f\left[\prod_{n' \in A(m)\backslash n} f(|\beta_{mn'}|)\right] \tag{2}$$

Here, A(m) denotes a set of column indexes for which the value is 1 in the m-th row of the parity check matrix H, and A(m)\n denotes a set difference obtained by removing n from the set A(m). Here, n'≠n with respect to the row processing output value $\alpha_{mn}$. In the present embodiment, the optical disk device is not provided with a row processing output value storage memory for storing the row processing output value $\alpha_{mn}$, but the optical disk device may be provided with a row processing output value storage memory. Further, the functions sign(x) and f(x) are defined by the following Equations (3) and (4).

$$\mathrm{sign}(x) = \begin{cases} 1 & (x > 0) \\ -1 & (x < 0) \\ 0 & (x = 0) \end{cases} \tag{3}$$

$$f(x) = \log_e\left(\frac{e^x + 1}{e^x - 1}\right) \tag{4}$$

The column processing computation device 204 performs the computation processing (column processing) according to Equation (5) below by using the reliability $\lambda_n$ saved in the reliability storage memory 202 and the row processing output value $\alpha_{mn}$ outputted from the row processing computation device 203. The computation processing result is outputted as the column processing output value $\beta_{mn}$. The column processing computation device 204 saves the column processing output value $\beta_{mn}$ in the first column processing output value storage memory 205.

$$\beta_{mn} = \sum_{m' \in B(n)\backslash m} \alpha_{m'n} + \lambda_n \tag{5}$$

Here, B(n) denotes a set of row indexes for which the value is 1 in the n-th column of the parity check matrix H, and B(n)\m denotes a set difference obtained by removing m from the set B(n). Here, m'≠m with respect to the column processing output value $\beta_{mn}$.

The estimated word generating device 206 computes the estimated word reliability $L_n$ on the basis of the following Equation (6) by using the reliability $\lambda_n$ saved in the reliability storage memory 202 and the row processing output value $\alpha_{mn}$ outputted from the row processing computation device 203. Equation (6) differs from Equation (5) in that the value of the row processing output value $\alpha_{mn}$ from the element m to the element n of the parity check matrix are themselves also added to the computation of the estimated word reliability $L_n$.

$$L_n = \sum_{m' \in B(n)} \alpha_{m'n} + \lambda_n \qquad (6)$$

The absolute value of the estimated word reliability $L_n$ represents the reliability of estimation, and the greater is the absolute value of the estimated word reliability $L_n$, the higher is the reliability of estimation. The estimated word generating device 206 determines according to Equation (7) below that the value of the estimated word $x_n$ is "0" when the value of the estimated word reliability $L_n$ is positive, determines that the value of the estimated word $x_n$ is "1" when the value of the estimated word reliability $L_n$ is negative, and outputs the determined estimated word $x_n$. The estimated word generating device 206 saves the estimated word $x_n$ in the estimated word storage memory 207.

$$x_n = \begin{cases} 0 (L_n > 0) \\ 1 (L_n < 0) \end{cases} \qquad (7)$$

The decoding result determination evince 208 determines whether the estimated word $x_n$ saved in the estimated word storage memory 207 is decoded correctly. The control device 211 determines whether to end the decoding processing or perform continuously and repeatedly the decoding processing on the basis of the determination result of the decoding result determination device 208 and the below-described number of processing loops. When the continuous repeated decoding processing is performed, the row processing computation device 203 performs the row processing by using the column processing output value $\beta_{mn}$ saved in the first column processing output value storage memory 205 and updates the row processing output value $\alpha_{mn}$. Then, the column processing computation device 204 updates the column processing output value $\beta_{mn}$ by using the updated row processing output value $\alpha_{mn}$ and the reliability $\lambda_n$. Further, the estimated word generating device 206 updates the estimated word reliability $L_n$ by using the updated row processing output value $\alpha_{mn}$ and the reliability $\lambda_n$ and generates the estimated word $x_n$ from the estimated word reliability $L_n$. The specific sequence will be described below in greater detail by using a flowchart.

More specifically, the decoding result determination unit 208, for example, performs parity check with respect to the estimated word $x_n$, and where the parity check condition is satisfied, determines that no error is present in the estimated word $x_n$. Alternatively, the decoding result determination unit 208 may perform the determination by using the estimated word reliability $L_n$. Thus, the decoding result determination unit 208 may determine that the estimated word $x_n$ is stochastically correct when the average value of the absolute values of all of the estimated word reliability $L_n$ satisfies a predetermined condition, for example, when the average value of the absolute values of all of the estimated word reliability $L_n$ is equal to or greater than a predetermined value. The determination can be also made by using the row processing output value $\alpha_{mn}$ or column processing output value $\beta_{mn}$ instead of the estimated word reliability $L_n$. It is also possible to embed an error detection code that can determine an error in data blocks in advance and perform the determination on the basis of the detection result of the error detection code. The present embodiment can be realized and the same result can be obtained with any configuration of the decoding result determination device 208 of the present embodiment, provided that it is possible to determine that the data block is an error.

Where the decoding processing is ended, the decoding determination result and decoded data are outputted to the outside of the error correcting device 110. Those processing operations are executed on the basis of the control performed by the control device 211.

The decoding processing (cyclic reproduction processing) performed when the reproduced data $y_i$ are inputted a plurality of times into the error correcting device 110 of the present embodiment will be explained below with reference to the configuration shown in FIG. 2.

Where the presence of an error is determined by the decoding result determination device 208 even when the decoding processing is performed in the preset number of processing loops in the decoding processing performed when the aforementioned reproduced data $y_i$ are inputted once, the control device 211 determines that error correction is impossible in the decoding processing of the inputted reproduced data and reproduces again the data block same as that of the previous cycle. The reproduction of the data block same as that of the previous cycle is performed on the basis of the address information detected by the address detection device 112.

The reliability generating device 201 generates reliability $\lambda_{2n}$ with respect to the reproduced data $y_{2i}$ of the second cycle according to Equation (8) below from the reproduced data $y_{2i}$ of the second cycle obtained by reproducing the data block same as that of the previous cycle. The reliability generating device 201 saves the generated reliability $\lambda_{2n}$ in the reliability storage memory 202.

$$\lambda_{2n} = \frac{2y_{2i}}{\sigma^2} \qquad (8)$$

Then, the row processing computation device 203 determines the row processing output value $\alpha_{mn}$. In this case the decoding processing of the second cycle differs from the decoding processing of the first cycle in that in the decoding processing of the first cycle, the row processing computation device 203 performs computations by taking "0" as the initial value of the column processing output value $\beta_{mn}$, whereas in the decoding processing of the second cycle, the row processing computation device 203 performs computations by taking the final value of the column processing output value $\beta_{mn}$ of the decoding processing of the first cycle as the initial value.

Where the final value of the column processing output value of the decoding processing of the first cycle is taken as $\beta_{1mn}$, the row processing output value $\alpha_{2mn}$ of the second cycle is equal to the final value $\alpha_{1mn}$ of the row processing output value of the decoding processing of the first cycle, as shown in Equation (9) below.

$$\alpha_{2mn} = \alpha_{1mn} \qquad (9)$$
$$= \left[ \prod_{n' \in A(m) \setminus n} \text{sign}(\beta_{1mn'}) \right] f \left[ \prod_{n' \in A(m) \setminus n} f(|\beta_{1mn'}|) \right]$$

As a result, the column processing output value $\beta_{2mn}$ in the decoding processing of the second cycle and the estimated word reliability $L_{2n}$ can be determined from Equations (10) and (11) below.

$$\beta_{2mn} = \sum_{m' \in B(n) \backslash m} \alpha_{1m'n} + \lambda_{2n} \quad (10)$$

$$L_{2n} = \sum_{m' \in B(n)} \alpha_{1m'n} + \lambda_{2n} \quad (11)$$

In this case, the column processing output value $\beta_{2mn}$ in the decoding processing of the second cycle and the estimated word reliability $L_{2n}$ use both the energy ($\alpha_{1m'n}$) of the reproduced signal of the first cycle and the energy ($\lambda_{2n}$) of the reproduced signal of the second cycle. Therefore, the reliability can be obtained that is higher than that obtained only from the respective reproduced signals.

Figure 3:
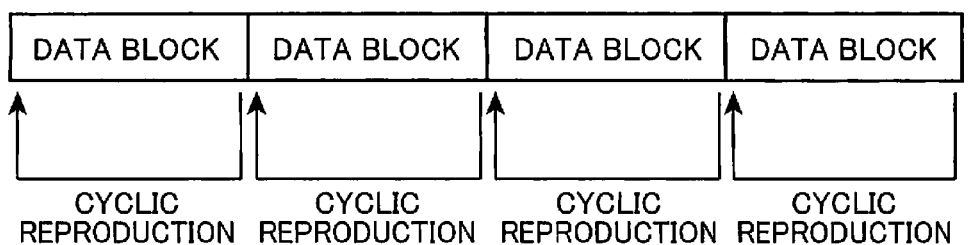
FIG. 3 explains the processing of repeatedly reproducing data for each data block.
Figure 4:
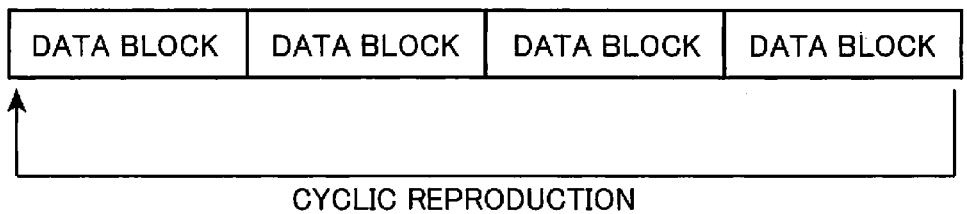
FIG. 4 explains the processing of reproducing data by using a plurality of data blocks as a single reproduction unit.

FIGS. 3 and 4 illustrate the processing performed to reproduce cyclic data in Embodiment 1. FIG. 3 illustrates the processing performed to reproduce cyclic data for each data block, and FIG. 4 illustrates the processing performed to reproduce data by taking a plurality of data blocks as a single reproduction unit.

When cyclic data are reproduced for each data block as shown in FIG. 3, the column processing computation device 204 can update, by overwriting, the column processing output value $\beta_{mn}$. Therefore, the error correcting device 110 may be provided with a single first column processing output value storage memory 205.

By contrast, when the cyclic data are reproduced by taking a plurality of data blocks as a single reproduction unit, as shown in FIG. 4, the column processing computation device 204 should extracts and save only the column processing output value $\beta_{mn}$ of the data block for which the decoding detection result was an error. Therefore, the column processing computation device 204 uses different memory spaces inside the first column processing output value storage memory 205 or uses the second column processing output value storage memory 209.

When cyclic data are reproduced, the control device 211 transfers the column processing output value $\beta_{mn}$ saved in the different memory spaces in the first column processing output value storage memory 205 or in the second column processing output value storage memory 209 to the first column processing output value storage memory 205. As a result, the final value of the column processing output value $\beta_{mn}$ of the decoding processing loop of the previous cycle can be used as the initial value of the column processing output value $\beta_{mn}$ of the decoding processing loop of the next cycle.

The storage capacity of the first column processing output value storage memory 205 almost always has a fixed upper limit determined by system configuration. Therefore, faster reproduction can be realized by controlling the cyclic reproduction processing according to the usage mode of the first column processing output value storage memory 205. More specifically, it is more preferred that the control be performed such as to make a transition to the cyclic reproduction processing when the storage capacity of the first column processing output value storage memory 205 reaches the upper limit. Since the time till a transition is made to the cyclic reproduction processing is the delay time of data reproduction, it is more desirable that the control be performed with consideration from the delay time of data reproduction.

Thus, the merit of the method for reproducing cyclic data by taking a plurality of data blocks as a single reproduction unit is that the unnecessary seek time and rotation stand-by time are shortened and sufficient decrease in the transfer speed is prevented. Furthermore, the decrease in the transfer speed can be even further prevented by adjusting the length of the data block in which the cyclic data arte reproduced, so as to minimize the rotation stand-by time which is the main component of processing time. The control for reproducing the same data block a plurality of times is initiated by a command from the control device 211.

Figure 5:
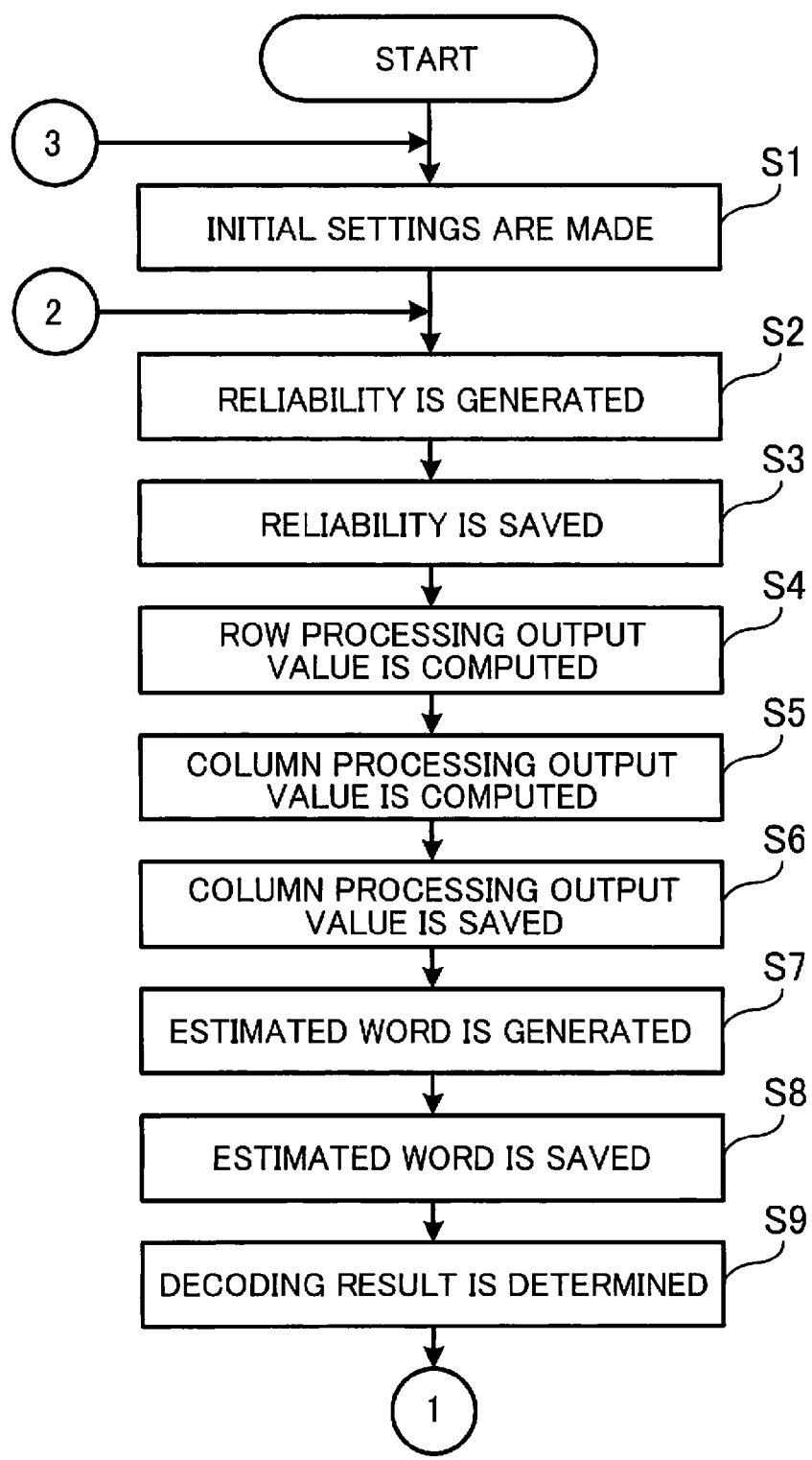
FIG. 5 is the first flowchart for explaining the decoding processing in the error correcting device in Embodiment 1 of the present invention.
Figure 6:
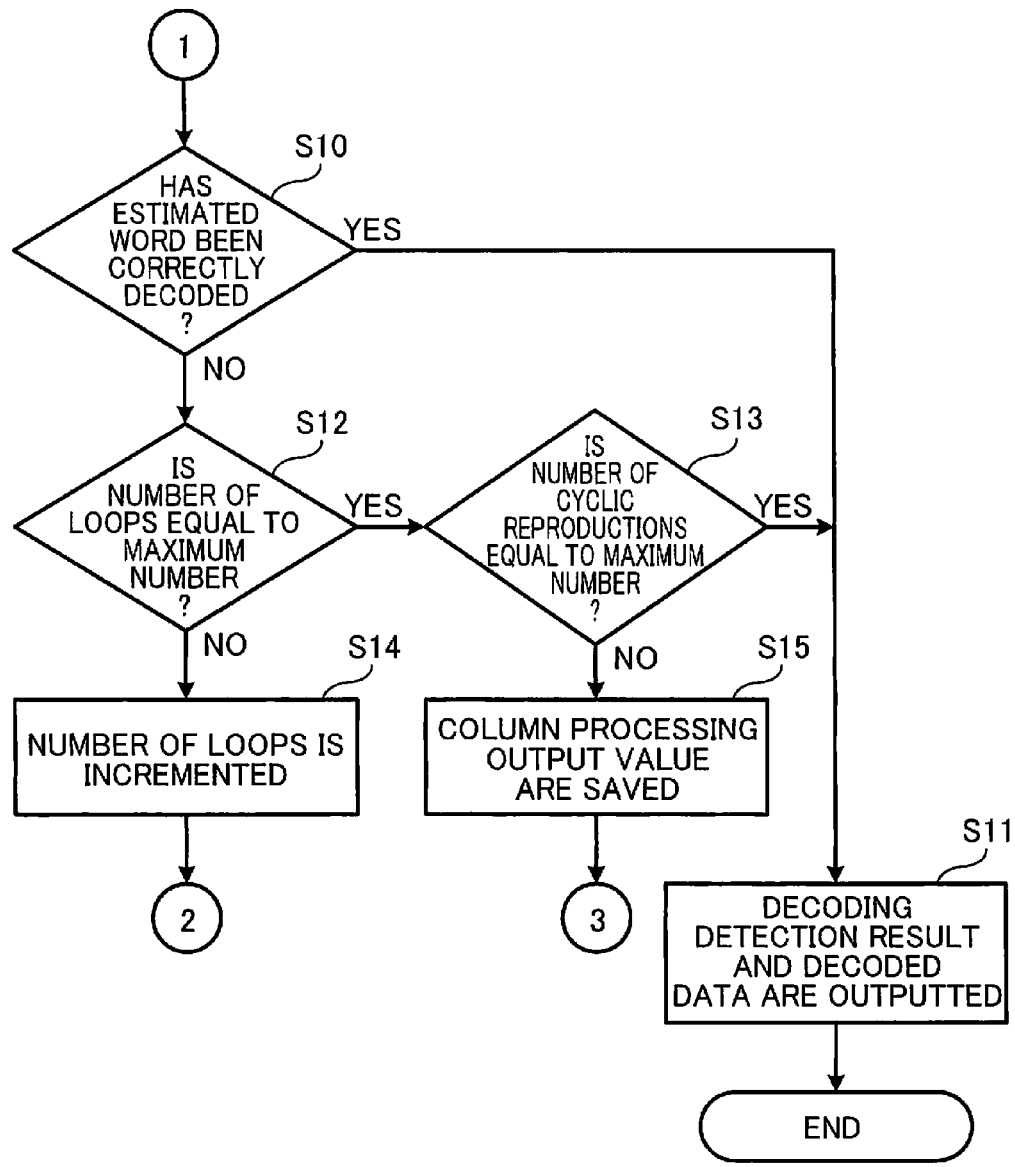
FIG. 6 is the second flowchart for explaining the decoding processing in the error correcting device in Embodiment 1 of the present invention.

The decoding processing performed by the error correcting device 110 in Embodiment 1 of the present invention is explained below. FIGS. 5 and 6 are flowcharts illustrating the decoding processing performed by the error correcting device in Embodiment 1 of the present invention.

First, the control device 211 performs initial setting to the number of loops in the decoding processing, the number of cyclic reproduction processing operations, and the column processing output value $\beta_{mn}$ as the initial settings (step S1). The number of loops in the decoding processing is the number of times the processing of generating the row processing output value $\alpha_{mn}$ is performed again in the row processing computation device 203 by using the column processing output value $\beta_{mn}$ generated in the column processing computation device 204. The control device 211 sets a predetermined maximum number in advance as the number of loops in the decoding processing. The number of cyclic reproduction processing operations is the number of times the same data block is repeatedly reproduced. The control device 211 sets a predetermined maximum number in advance as the number of cyclic reproduction processing operations. As mentioned hereinabove, the control device 211 sets the column processing output value $\beta_{mn}$ to 0 during the reproduction processing of the first cycle.

Then, the reliability generating device 201 generates the reliability $\lambda_n$ according to the received reproduced data sequence (step S2).

The reliability generating device 201 then saves the generated reliability $\lambda_n$ in the reliability storage memory 202 (step S3).

The row processing operation device 203 computes the row processing output value $\alpha_{mn}$ from the column processing output value $\beta_{mn}$ by performing the row processing (step S4). As mentioned hereinabove, the column processing output value $\beta_{mn}$, during the initial reproduction is set to 0.

The column processing computation device 204 then computes the column processing output value $\beta_{mn}$ from the reliability $\lambda_n$ and row processing output value $\alpha_{mn}$ by performing the column processing (step S5).

The column processing computation device 204 then saves the computed column processing output value $\beta_{mn}$ in the first column processing output value storage memory 205 (step S6).

The estimated word generating device 206 then generates the estimated word reliability $L_n$ from the reliability $\lambda_n$ and row processing output value $\alpha_{mn}$ and generates estimated word $x_n$ according to the positive or negative sign of the generated estimated word reliability $L_n$ (step S7). For example, where the estimated word reliability $L_n$ is represented in two's complement when the sign of the estimated word reliability $L_n$ is determined, the estimated word generating device 206 can determine the positive or negative sign by the value of the code bit of the highest rank.

The estimated word generating device 206 then saves the generated estimated word $x_n$ in the estimated word storage memory 207 (step S8).

Where all of the estimated word $x_n$ are generated, the decoding result determination device 208 determines the decoding result (step S9).

For example, when the decoding result is determined by parity check, the decoding result determination device 208 calculates $H \cdot (x_1, x_2, \ldots, x_n)^T$ by using the transpose matrix of the n-bit estimated word $(x_1, x_2, \ldots, x_n)$ and the parity check matrix H. Where the calculation result indicates that the syndrome which is to be generated is 0, the decoding result determination device 208 determines that the estimated word have been decoded correctly, and where the syndrome which is to be generated is not 0, the decoding result determination device determines that the estimated word have been erroneously decoded. The decoding result determination device 208 outputs the determination results to the control device 21.

Alternatively, when the decoding result is determined by using the estimated word reliability $L_n$, the following definitions may be used: the estimated word is 0 when the estimated word reliability $L_n$ is greater than 0, conversely the estimated word is 1 when the estimated word reliability $L_n$ is less than 0, and the likelihood of the estimated word decreases as the estimated word reliability approaches 0. Thus, where the average value of the absolute values of all of the estimated word reliability $L_n$ is equal to or greater than a predetermined threshold, the decoding result determination device 208 determines that the estimated word are stochastically correct and, therefore, have been decoded correctly. Meanwhile, where the average value of the absolute values of all of the estimated word reliability $L_n$ is less than the predetermined threshold, the decoding result determination device 208 determines that erroneous decoding has been performed.

The decoding result determination device 208 may determine the decoding result by detecting the number of errors by using coding for error detection.

The control device 211 determines whether or not the estimated word have been determined correctly as a result of decoding determination performed by the decoding result determination device 208 (step S10). In this case, when it is determined that the estimated word have been decoded correctly (YES in step S10), the control device 211 performs the control such that the estimated word $(x_1, x_2, \ldots, x_n)$ is outputted together with the determination result as decoded data from the estimated word storage memory 207 (step S11).

Meanwhile, where it is determined that the estimated word have not been decoded correctly (NO in step S10), the control device 211 determines whether or not the number of loops is the maximum number (step S12). In this case, where it is determined that the number of loops is the maximum number (YES in step S12), the control device 211 determines whether or not the number of cyclic reproductions is the maximum number (step S13). For example, the control device 211 counts the number of times an estimated word has been generated, stops the loop processing relating to the respective coding when the counted number reaches a predetermined maximum number, and determines whether or not the number of cyclic reproductions is the maximum number.

The control device 211 may also count the number of row processing computation processing operations performed by the row processing computation device 203 and determine whether or not the number of computation processing operations has reached a predetermined maximum number.

Where it is determined that the number of cyclic reproductions is the maximum number (YES in step S13), the control device 211 performs the control such as to output the finally generated estimated word as the decoded data from the estimated word storage memory 207 (step S11). As a result, the increase in the unnecessary computation processing time with respect to a code with a high noise level and poor convergence can be prevented.

Further, where the number of loops is determined in step S12 not to be the maximum number (NO in step S12), the control device 211 increments the number of loops by 1 (step S14). Then, the control device 211 returns to the processing of step S2 and again executes the processing in step S2 and subsequent steps.

Where the number of cyclic reproductions is determined in step S13 not to be the maximum number (NO in step S13), the control device 211 performs the control such that the column processing output value that was the very last to be generated is saved in the second column processing output value storage memory 209 (step S15). Further, the control unit 211 returns to the processing of step S1 and repeats the processing of designating the region (data block) same as that in the previous cycle for cyclic reproduction, generating the reliability corresponding to the data block same as that in the previous cycle, and saving the generated reliability in the reliability storage memory 202. In this case, the system control device 116 generates the data block same as that in the previous cycle by using the address information detected by the address detection device 112. When the seek operation is performed on the basis of the address information, the data block same as that in the previous cycle can be reliably reproduced by performing the seek operation in the region preceding the target address.

The column processing output value $\beta_{mn}$ saved in the second column processing output value storage memory 209 represents the likelihood with respect to the reproduced data of the previous cycle, and by using this value as the initial value and performing cyclic decoding with respect to the reproduced data different from those of the previous cycle, it is possible to use a plurality of reproduction energies and, therefore, it is possible to correct an error that could not be corrected during the reproduction of the previous cycle.

Figure 7:
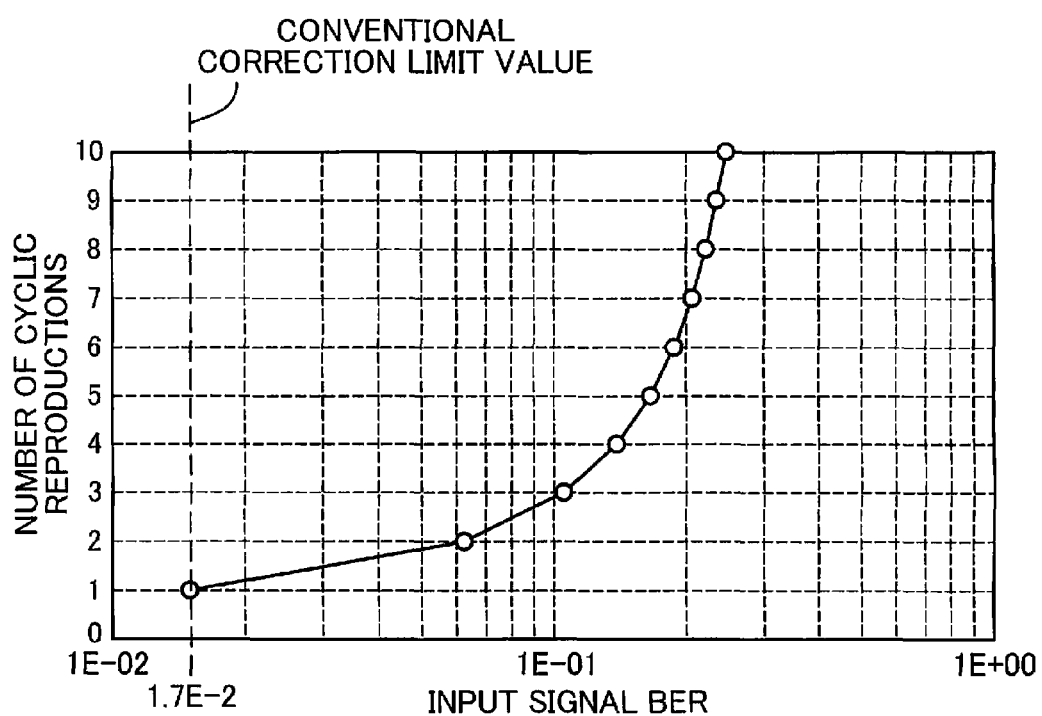
FIG. 7 shows a BER (bit error ratio) obtained with the error correcting device in Embodiment 1 of the present invention.

FIG. 7 shows a BER (bit error ratio) characteristic obtained with the error correcting device in Embodiment 1 of the present invention. In FIG. 7, the number of cyclic reproductions is plotted against the ordinate, and the BER limit value of the input signal necessary for error-free reproduction after error correction is plotted against the abscissa. In this case, the state in which the BER included in the signal after error correction is equal to or less than 1E-11 is defined as an error-free state.

In the conventional system in which the cyclic reproduction is not performed, the correction limit value of the BER of the input signal that can be reproduced without an error is 1.7E-2. However, by performing the cyclic reproduction of Embodiment 1, it is possible to perform error-free reproduction even with respect to an input signal with quality that is poor to a degree equal to or greater than the convention correction limit value.

With the conventional method of averaging the waveform after A/D conversion, for example, when the BER of the input signal corresponds to a quality level of 1E-1, a large number of synchronization shifts occurs depending on whether or not the error detection of the synchronization pattern is performed, and error-free reproduction is impossible. However, with the method of Embodiment 1 of the present invention, error-free reproduction can be also performed with respect to an input signal which is poor in quality at a level equal to or greater than 1E-1, and reliability much higher than that of the conventional method can be obtained.

With such a configuration, reliability information on data blocks is inputted a plurality of times and the column processing output value $\beta_{mn}$, which are the decoding results of the previous cycle, are used as the initial value during the next reproduction with respect to the data block having a signal of poor quality such that cannot be error-corrected with the conventional system in which the cyclic reproduction processing is not performed. As a result, a plurality of reproduction energies can be used and the reduction of error rate unattainable with the conventional methods can be realized. Further, since a plurality of reproduction processing operations is performed by using a reproduction signal for which the synchronization shift timing has been compensated in the demodulator 109, a plurality of reproduction processing operations is not performed in a state in which synchronization shift, which is the problem inherent to the conventional method, has occurred.

Embodiment 2

The decoding apparatus and decoding method according to Embodiment 2 of the present invention will be described below in greater detail with reference to the appended drawings.

Figure 8:
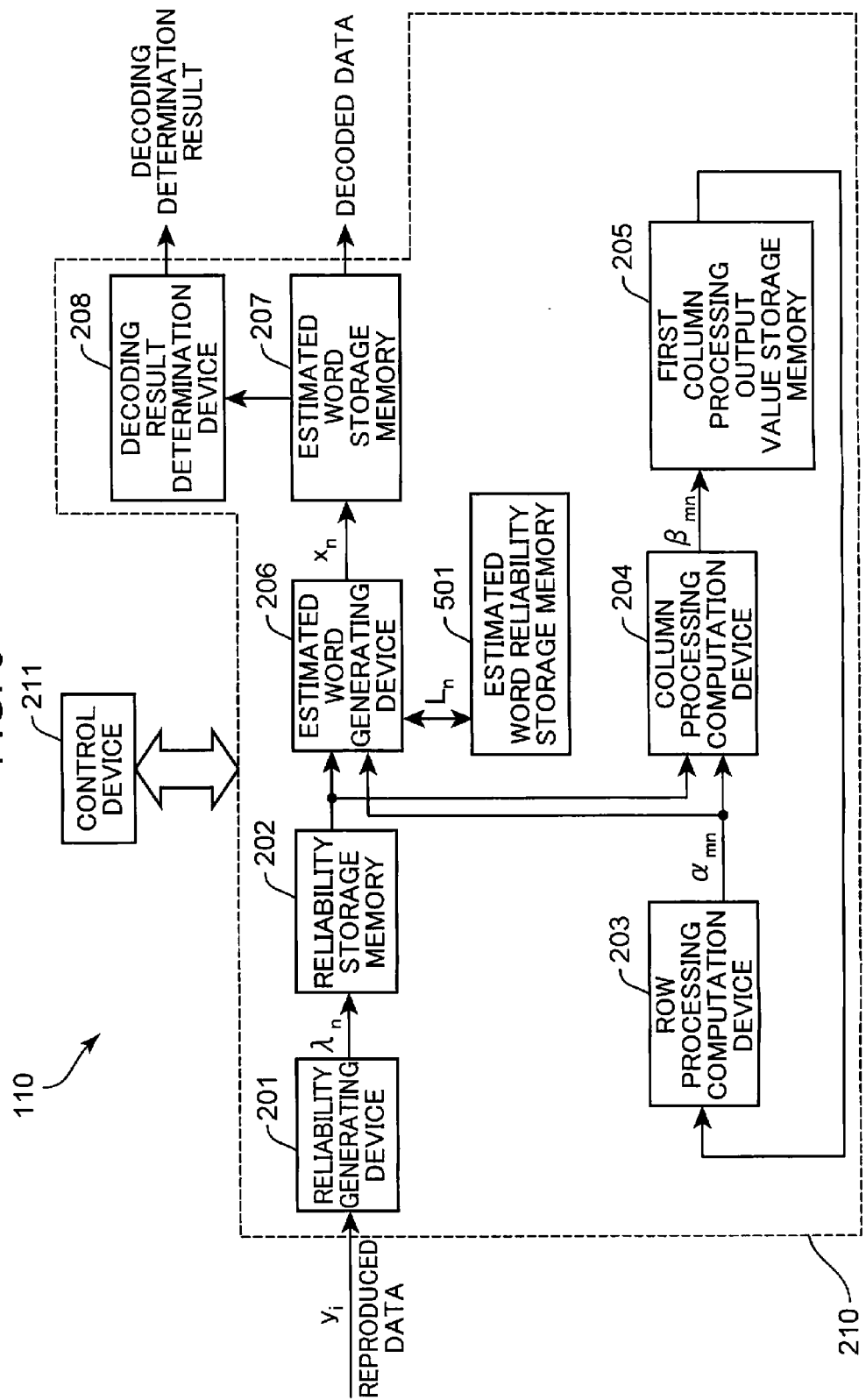
FIG. 8 shows the detailed configuration of the error correcting device according to Embodiment 2 of the present invention.

FIG. 8 is a detailed configuration of the error correcting device according to Embodiment 2 of the present invention. The configuration of the optical disk device according to Embodiment 2 is the same as the configuration of the optical disk device according to Embodiment 1 shown in FIG. 1 and the explanation thereof is herein omitted. In FIG. 8, constituent elements same as those of the error correcting device of Embodiment 1 shown in FIG. 2 are assigned with like reference numerals and the explanation thereof is herein omitted. The difference between the error correcting device of Embodiment 2 shown in FIG. 8 and the error correcting device of Embodiment 1 shown in FIG. 2 is that the error correcting device 110 is provided with an estimated word reliability storage memory 501 instead of the second column processing output value storage memory 209.

The error correcting device 110 shown in FIG. 8 is provided with the reliability generating device 201, reliability storage memory 202, row processing computation device 203, column processing computation device 204, first column processing output value storage memory 205, estimated word generating device 206, estimated word storage memory 207, decoding result determination device 208, control unit 211, and estimated word reliability storage memory 501.

The estimated word reliability storage memory 501 saves the estimated word reliability $L_n$ generated by the estimated word generating device 206.

The estimated word generating device 206 updates the estimated word reliability by using the computation processing based on stochastic computations and generates the estimated word according to the updated estimated word reliability on the basis of the estimated word reliability of the previous cycle saved in the estimated word reliability storage memory 501 and the reliability of estimated word generated on the basis of the reliability information and row processing output value inputted in the present cycle, when decoding using the reliability information on the data block same as that of the previous cycle is used.

The estimated word generating device 206 generates the estimated word according to the updated estimated word reliability when the estimated word reliability is saved in the estimated word reliability storage memory 501.

Figure 9:
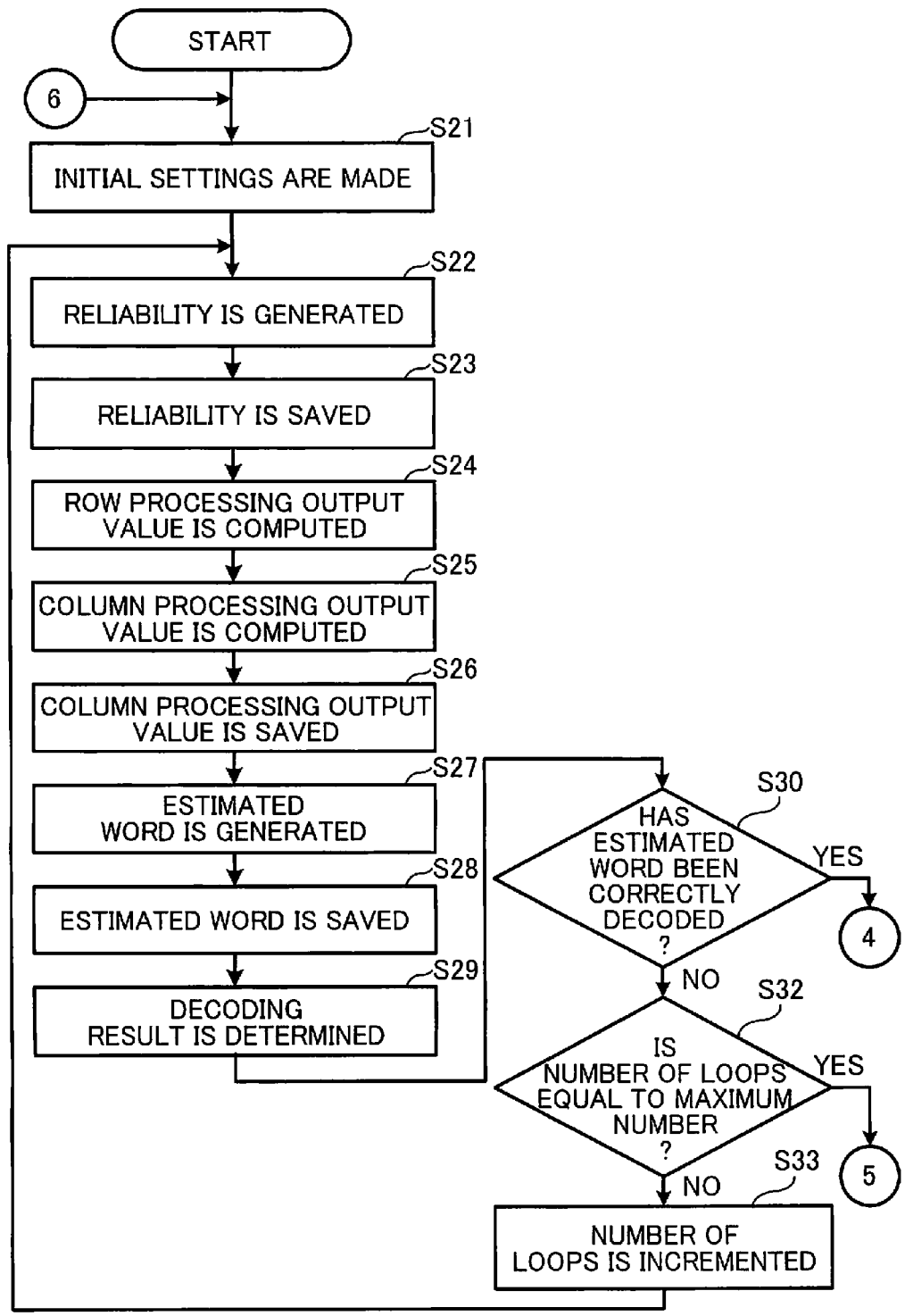
FIG. 9 is the first flowchart for explaining the decoding processing in the error correcting device in Embodiment 2 of the present invention.
Figure 10:
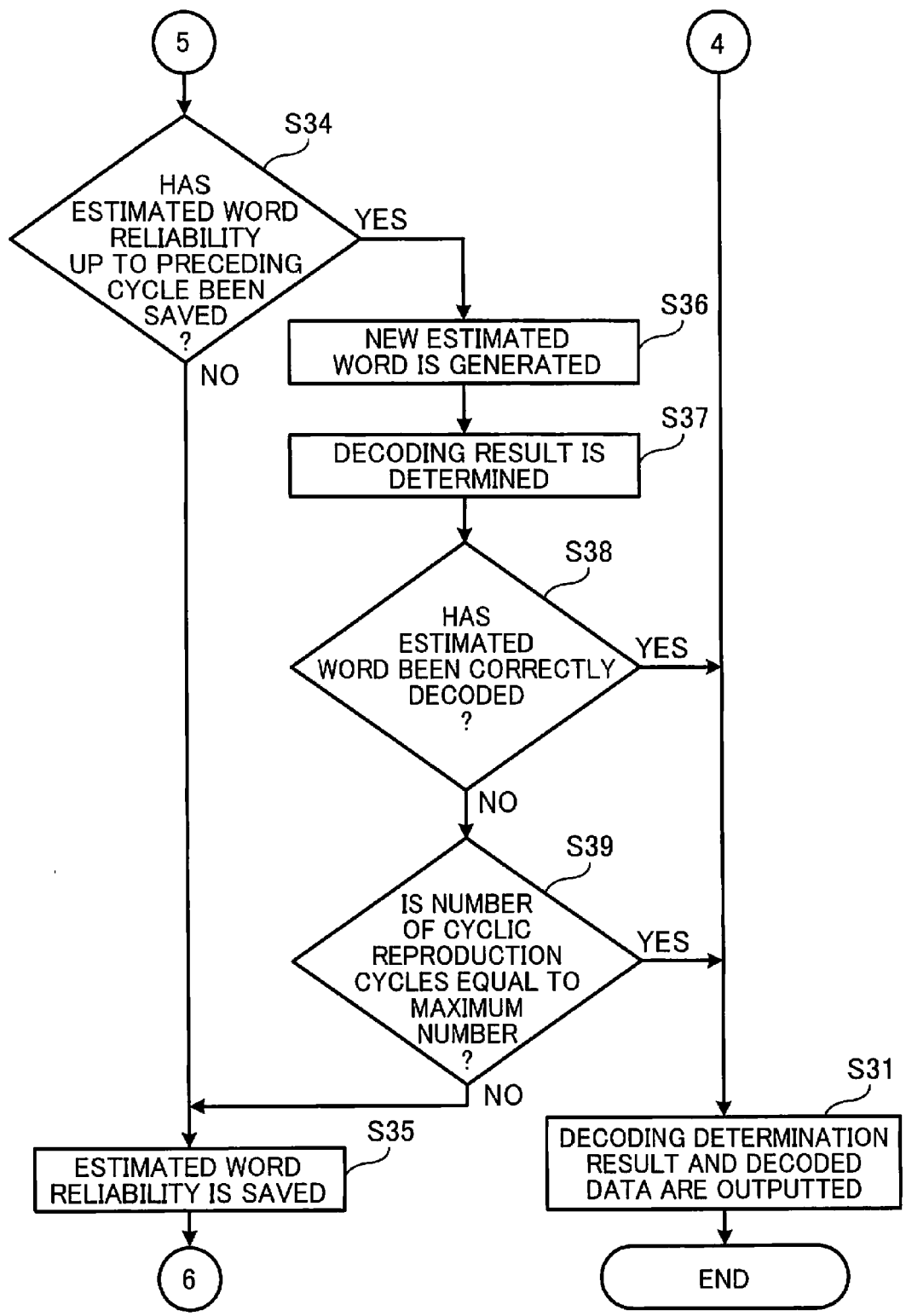
FIG. 10 is the second flowchart for explaining the decoding processing in the error correcting device in Embodiment 2 of the present invention.

FIGS. 9 and 10 are flowcharts illustrating the decoding processing performed by the error correcting device of Embodiment 2 of the present invention.

The processing of steps S21 to S33 shown in FIGS. 9 and 10 is the same as that of steps S1 to S12 and S14 shown in FIGS. 5 and 6 and the explanation thereof is herein omitted.

In Embodiment 2, when the estimated word is not correctly decoded even when the cyclic decoding processing is performed with respect to the inputted reproduced data (NO in step S30) and the number of loops has reached the prevented maximum number (YES in step S32), the control device 211 determines whether or not the estimated word reliability $L_n$ up to the previous cycle has been saved in the estimated word reliability storage memory 501 (step S34).

In this case, where it is determined that the estimated word reliability $L_n$ up to the previous cycle has not been saved in the estimated word reliability storage memory 501 (NO in step S34), the estimated word generating device 206 saves the estimated word reliability $L_n$ that is the very last to be generated in the estimated word reliability storage memory 501 (step S35). The control device 211 then returns to the processing of step S1 and again reproduces the data block same as that of the previous cycle. In this case, the system control device 116 generates a region (data block) same as that of the previous cycle by using the address information detected by the address detector 112.

Meanwhile, where it is determined that the estimated word reliability $L_n$ up to the previous cycle has been saved in the estimated word reliability storage memory 501 (YES in step S34), the estimated word generating device 206 uses the estimated word reliability $L_n$ that is the very last to be generated in step S27 and the estimated word reliability $L_n$ saved in the estimated word reliability storage memory 501, generates estimated word reliability $L_n'$ by the computation processing based on stochastic calculations, and generates new estimated word $x_n'$ according to the positive or negative sign of the generated estimated word reliability $L_n'$ (step S36).

The decoding result determination unit 208 then determines a determination result by using the generated new estimated word $x_n'$ (step S37).

Then, the control unit 211 determines whether or not the estimated word has been correctly decoded on the basis of the decoding determination result obtained with the decoding result determination device 208 (step S38). In this case, where it is determined that the estimated word has been correctly decoded (YES in step S38), the control device 211 performs the control such that the estimated word $x_n'$ are outputted together with the determination result as reproduced data from the estimated word storage memory 207 (step S31).

Meanwhile, where it is determined that the estimated word has not been decoded correctly (NO in step S38), the control device 211 determines whether or not the number of cyclic reproductions is the maximum number (step S39). In this case, where it is determined that the number of cyclic reproductions is the predetermined maximum number (YES in step S39), the control device 211 performs the control such that the estimated word $x_n'$ is outputted together with the determination result as reproduced data from the estimated word storage memory 207 (step S31).

Meanwhile, where it is determined that the number of cyclic reproductions is not the predetermined maximum number (NO in step S39), the estimated word generating device 206 saves the estimated word reliability $L_n$ that is the very last to be generated in the estimated word reliability storage memory 501 (step S35). The control device 211 then returns to the processing of step S1 and reproduces again the data block same as that of the previous cycle.

With such a configuration, reliability information on data blocks is inputted a plurality of times, estimated word reliability is generated by using computational processing based on stochastic computations on the basis of the estimated word reliability of the previous cycle and the estimated word reliability generated from the reproduced data of the present cycle, and new estimated word is generated by using the generated estimated word reliability, with respect to the data block having a signal of poor quality such that cannot be error-corrected with the conventional system in which the cyclic reproduction processing is not performed. As a result, a plurality of reproduction energies can be used and the reduction of error rate unattainable with the conventional methods can be realized in the same manner as in Embodiment 1.

Embodiment 3

The decoding apparatus and decoding method according to Embodiment 3 of the present invention will be described below in greater detail with reference to the appended drawings. The configuration of the optical disk device according to Embodiment 3 is the same as the configuration of the optical disk device according to Embodiment 1 shown in FIG. 1 and the explanation thereof is herein omitted.

The configuration of the error correcting device in Embodiment 3 is the same as that of the error correcting device in Embodiment 2 illustrated by FIG. 8. Therefore, the error correcting device of Embodiment 3 will be explained with reference to the error correcting device shown in FIG. 8.

Figure 11:
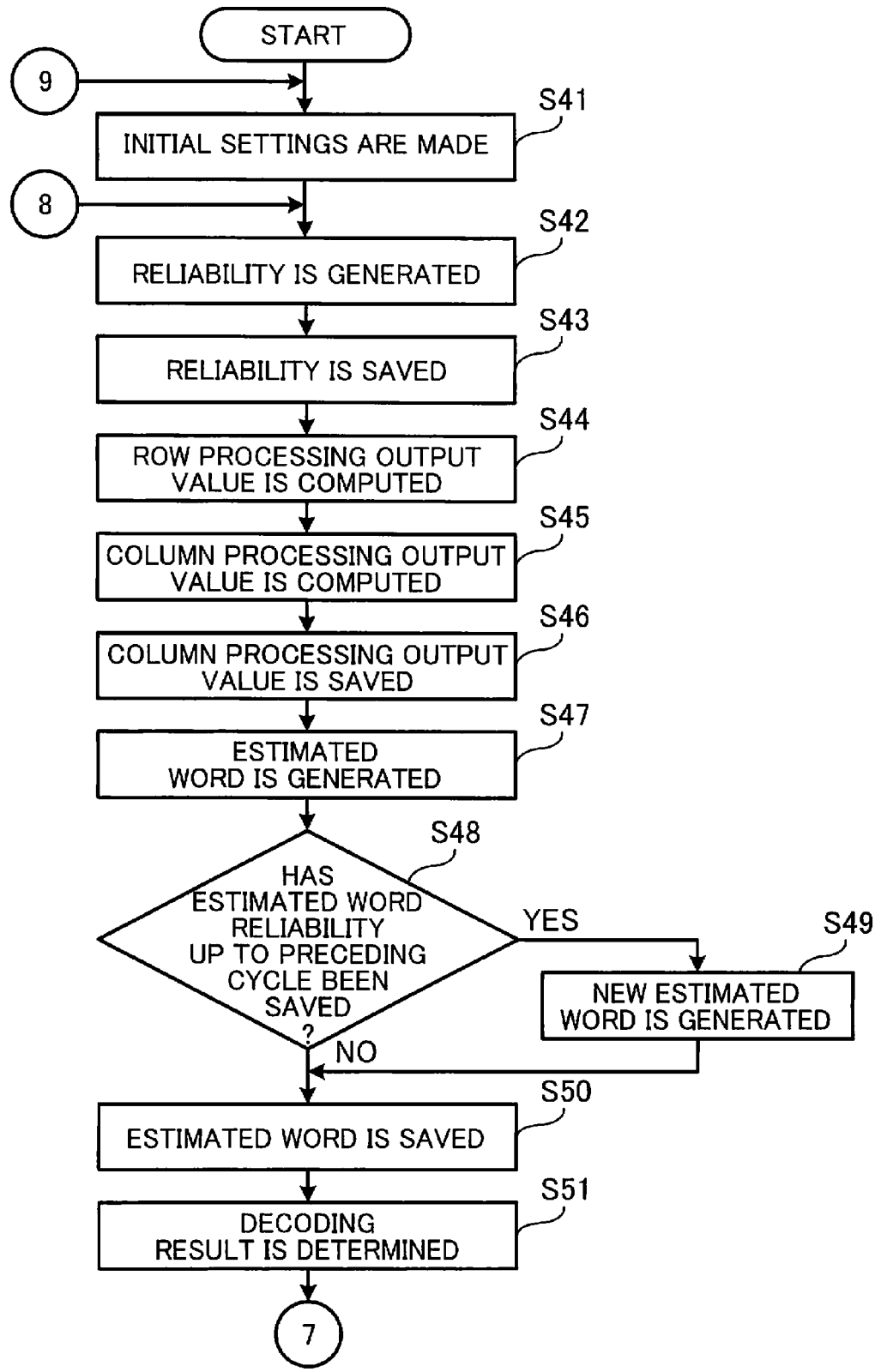
FIG. 11 is the first flowchart for explaining the decoding processing in the error correcting device in Embodiment 3 of the present invention.
Figure 12:
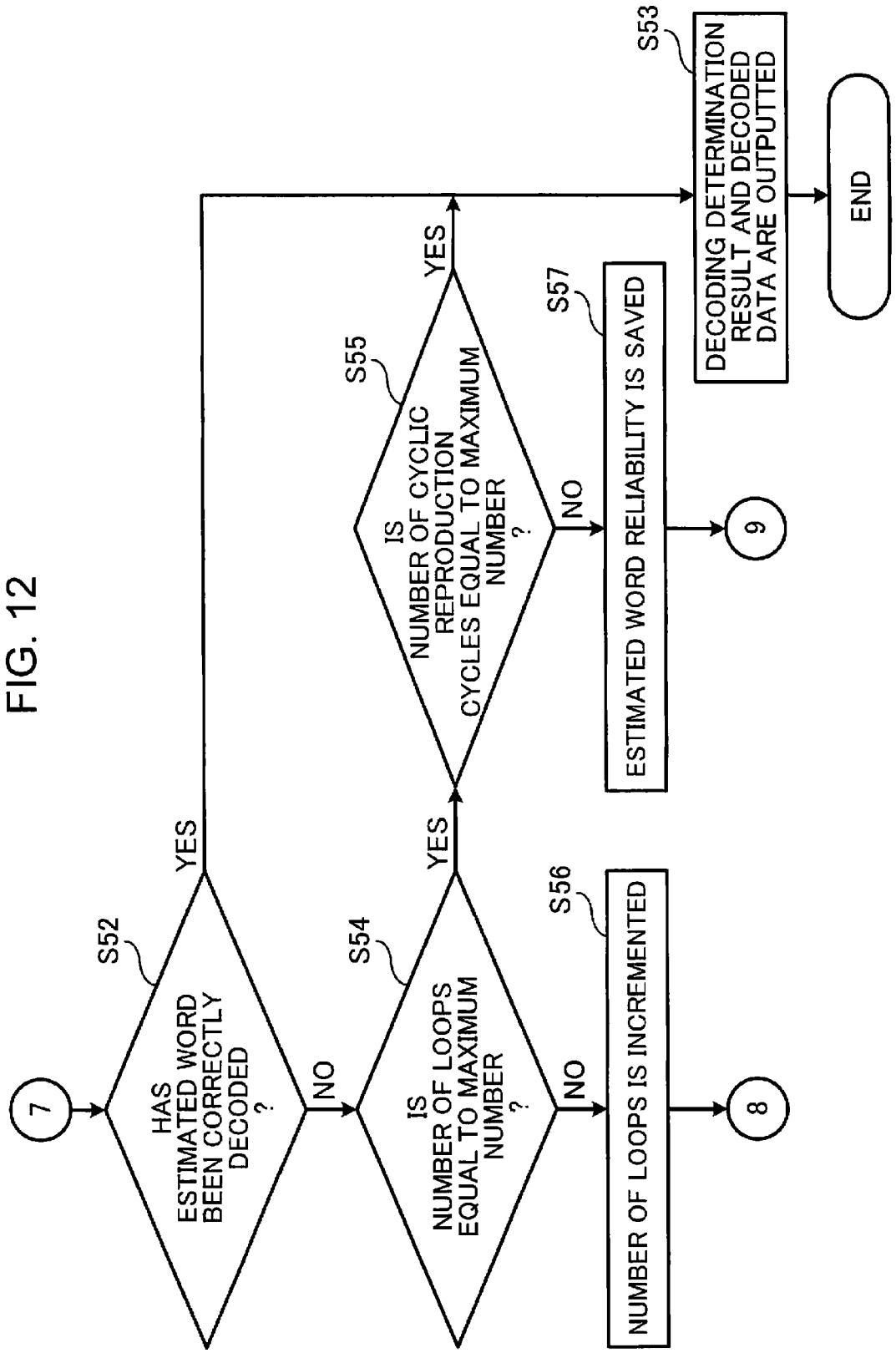
FIG. 12 is the second flowchart for explaining the decoding processing in the error correcting device in Embodiment 3 of the present invention.

FIGS. 11 and 12 are flowcharts illustrating the decoding processing performed by the error correcting device of Embodiment 3 of the present invention.

The difference between Embodiment 3 and Embodiment 2 of the present invention is that the step of generating new estimated word $x_n'$ is performed in the decoding processing loop, rather than after the number of loops has reached the predetermined maximum number, when performing the processing of reproducing again the data block same as that of the previous cycle. The estimated word generating device 206 generates new estimated word reliability $L_n'$ by performing the computation processing based on stochastic computations by using the estimated word reliability $L_n$ that have been generated in the present cycle and the estimated word reliability $L_n$ saved in the estimated word reliability storage memory 501. The estimated word generating device 206 generates the new estimated word $x_n'$ according to the positive or negative sign of the generated estimated word reliability $L_n'$.

The processing from step S41 to step S47 shown in FIG. 11 is the same as the processing from step S1 to step S7 shown in FIG. 5 and the explanation thereof is herein omitted.

Where the estimated word is generated in step S47, the control device 211 determines whether or not the estimated word reliability $L_n$ up to the previous cycle has been saved in the estimated word reliability storage memory 501 (step S48). In this case, where it is determined that the estimated word reliability $L_n$ up to the previous cycle has not been saved in the estimated word reliability storage memory 501 (NO in step S48), the estimated word generating device 206 saves the generated estimated word $x_n$ in the estimated word reliability storage memory 501 (step S50).

Meanwhile, where it is determined that the estimated word reliability $L_n$ up to the previous cycle has been saved in the estimated word reliability storage memory 501 (YES in step S48), the estimated word generating device 206 uses the estimated word reliability $L_n$ that is the very last to be generated in step S47 and the estimated word reliability $L_n$ saved in the estimated word reliability storage memory 501, generates the estimated word reliability $L_n'$ by the computation processing based on stochastic computations, and generates new estimated word $x_n'$ according to the positive or negative side of the generated estimated word reliability $L_n'$ (step S49). Then, the estimated word generating device 206 saves the generated estimated word $x_n'$ in the estimated word storage memory 207 (step S50).

The processing from step S51 to step S56 shown in FIGS. 11 and 12 is the same as the processing from step S9 to step S14 shown in FIGS. 5 and 6 and the explanation thereof is herein omitted.

Where it is determined in step S55 that the number of cyclic reproductions is not the maximum number (NO in step S55), the estimated word generating device 206 saves the estimated word reliability $L_n$ that is the very last to be generated in the estimated word reliability storage memory 501 (step S57). The control device 211 then returns to the processing of step S1 and reproduces again the data block same as that of the previous cycle.

With such a processing, new reliability is generated by using reliability generated from a plurality of reproduced signals, and the usual decoding processing loop is executed using the generated new reliability. Therefore, the decoding processing time can be further shortened, while demonstrating the effect same as that of Embodiment 1 and Embodiment 2.

Embodiment 4

The decoding apparatus and decoding method according to Embodiment 4 of the present invention will be described below in greater detail with reference to the appended drawings.

Figure 13:
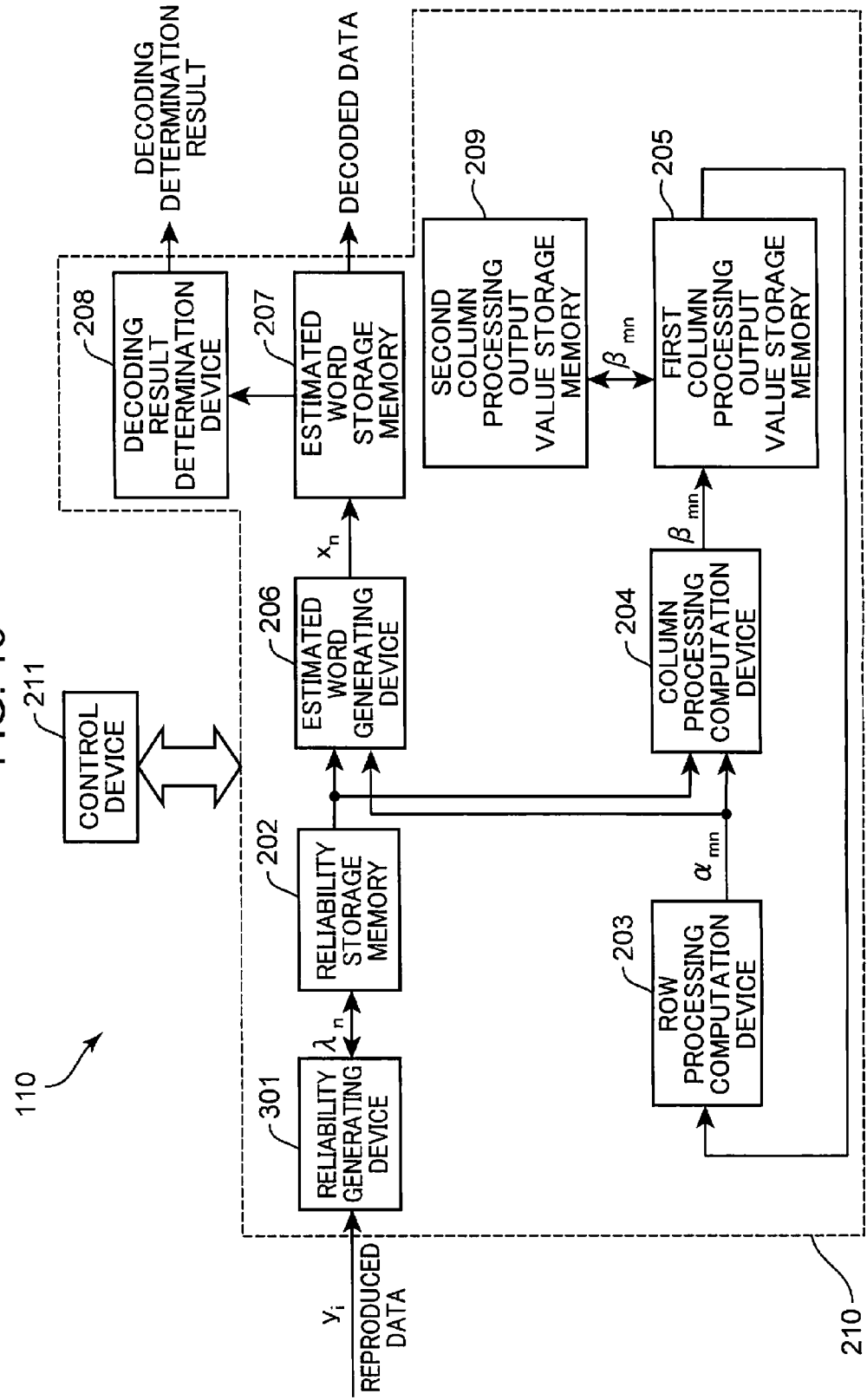
FIG. 13 shows the detailed configuration of the error correcting device according to Embodiment 4 of the present invention.

FIG. 13 shows the detailed configuration of the error correcting device according to Embodiment 4 of the present invention. The configuration of the optical disk device according to Embodiment 4 is the same as the configuration of the optical disk device according to Embodiment 1 shown in FIG. 1 and the explanation thereof is herein omitted. In FIG. 13, the constituent elements same as those of the error correcting device of Embodiment 1 shown in FIG. 2 are assigned with like reference numerals and the explanation thereof is herein omitted.

The error correcting device 110 shown in FIG. 13 is provided with a reliability generating device 301, the reliability storage memory 202, row processing computation device 203, column processing computation device 204, first column processing output value storage memory 205, estimated word generating device 206, estimated word storage memory 207, decoding result determination device 208, second column processing output value storage memory 209, and control device 211.

The difference between the error correcting device of Embodiment 4 shown in FIG. 13 and the error correcting device of Embodiment 1 shown in FIG. 2 is that the reliability generating device 301 not only saves the reliability information in the reliability storage memory 202, but also generates new reliability information by using the reliability information up to the preceding cycle that has been saved in the reliability storage memory 202.

The reliability generating device 301 generates reliability information by performing computation processing based on stochastic computations and saves the generated reliability information in the reliability storage memory 202 by using the reliability information that has been generated in the previous cycle and saved in the reliability storage memory 202 and the reliability information generated in the present cycle, when the decoding is performed using the reliability information on the data block same as that of the previous cycle.

The column processing computation device 204 computes column processing output value by using the reliability information obtained by the computation processing and saved in the reliability storage memory 202 and the row processing output value.

Figure 14:
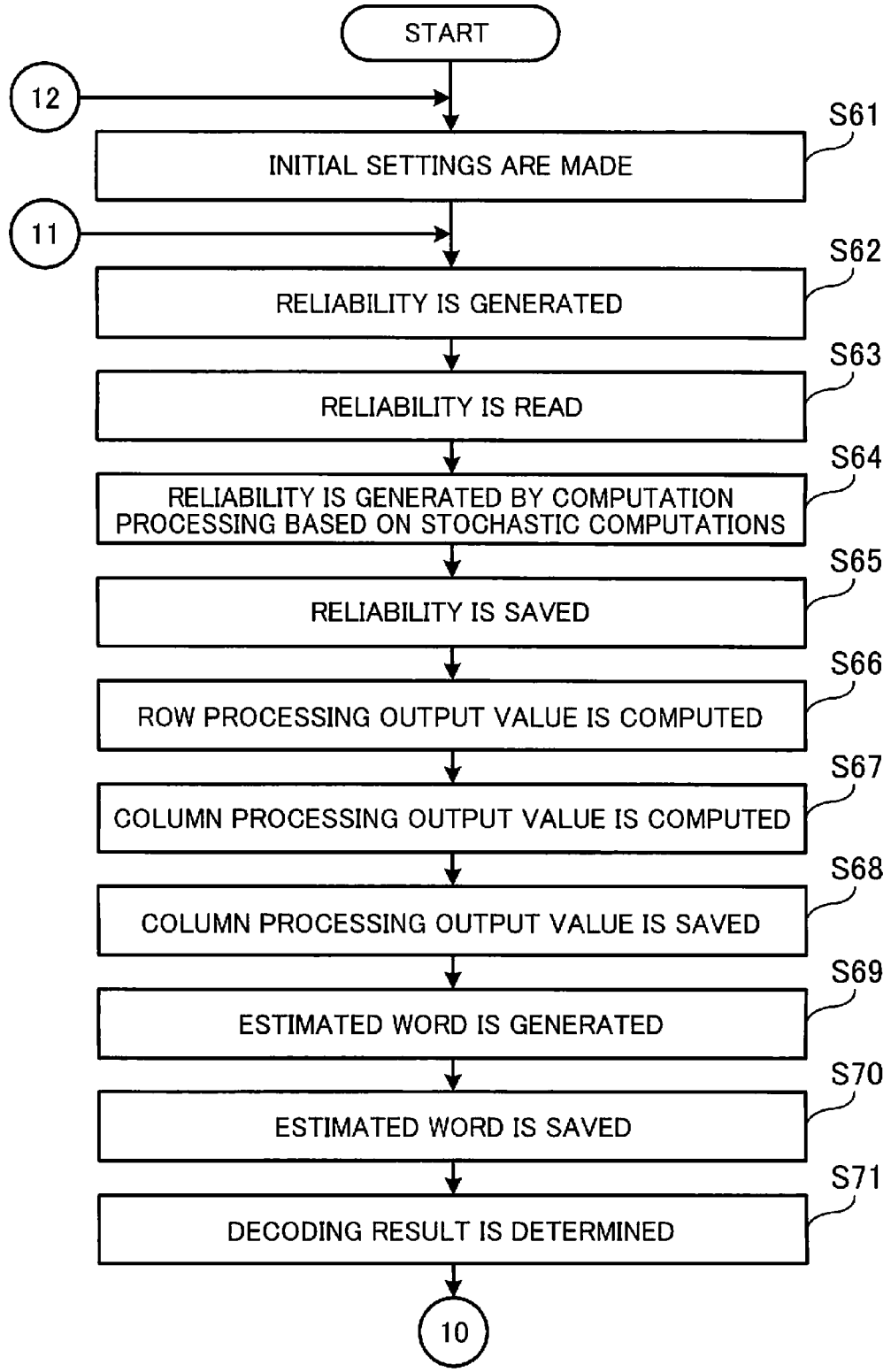
FIG. 14 is the first flowchart for explaining the decoding processing in the error correcting device in Embodiment 4 of the present invention.
Figure 15:
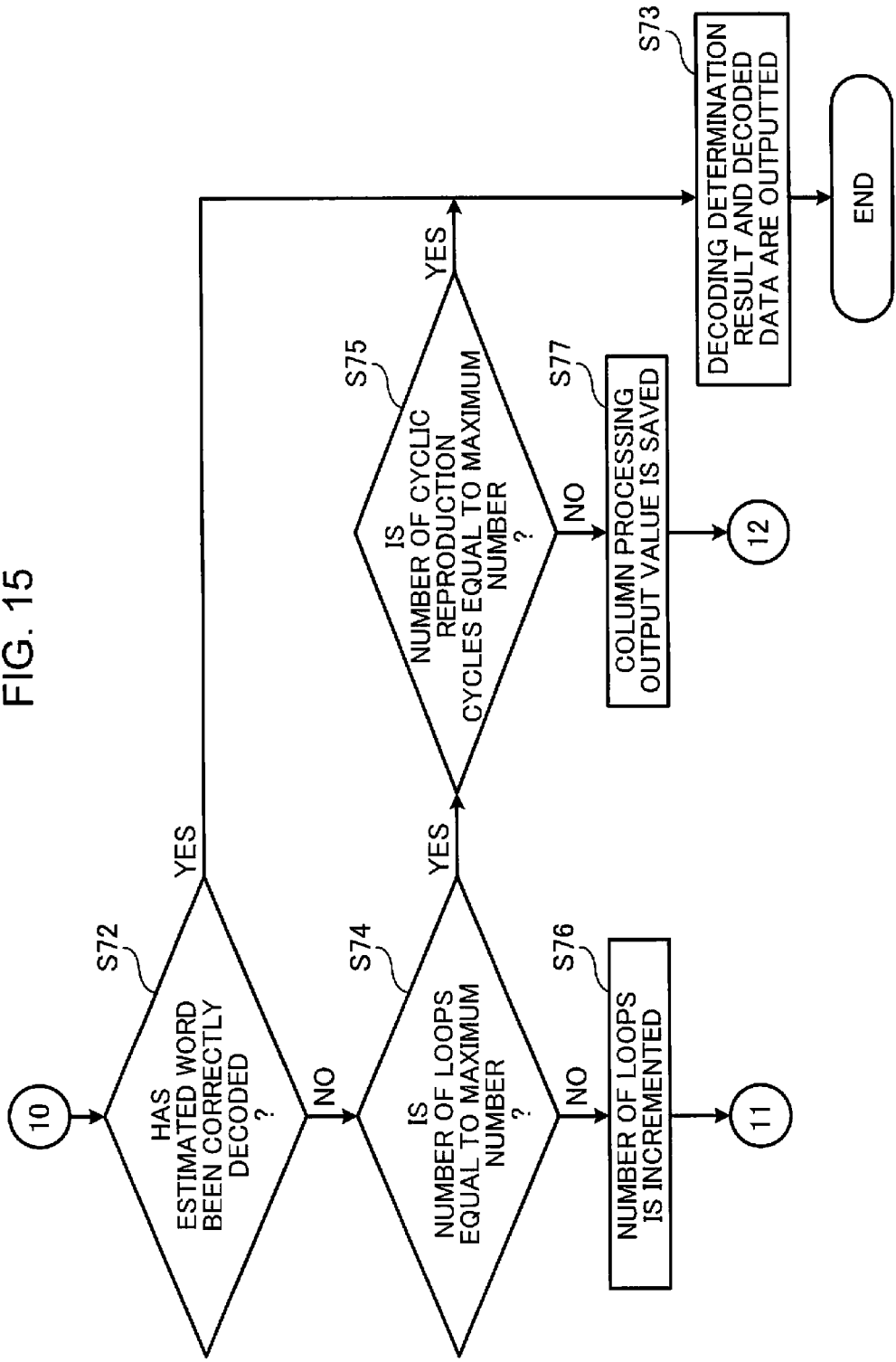
FIG. 15 is the second flowchart for explaining the decoding processing in the error correcting device in Embodiment 4 of the present invention.

FIGS. 14 and 15 are flowcharts illustrating the decoding processing performed by the error correcting device of Embodiment 4 of the present invention.

The processing of steps S61, S62, and S65 to S77 shown in FIGS. 14 and 15 is the same as the processing of steps S1 to S15 shown in FIGS. 5 and 6 and the explanation thereof is herein omitted.

Where reliability $\lambda_n$ is generated in step S62, the reliability generating device 301 reads the reliability $\lambda_n$ up to the previous cycle that have been saved in the reliability storage memory 202 (step S63).

The reliability generating device 301 then generates reliability information by performing computation processing based on stochastic computations by using the generated reliability $\lambda_n$ and the reliability $\lambda_n$ up to the previous cycle that have been read form the reliability storage memory 202, according to the received reproduced data sequence (step S64).

When the reliability $\lambda_n$ up to the previous cycle are not saved in the reliability storage memory 202, the processing of steps S63 and S64 is not performed and the generated reliability $\lambda_n$ is saved in the reliability storage memory 202.

The processing of step S65 and subsequent steps is the same as that of Embodiment 1, but the decoding processing is performed using the reliability obtained by computation processing based on stochastic computations.

For example, where a reliability indicator is defined by an amplitude value, the averaging of reliability information may be used as the computation processing based on stochastic computations. Where a reliability indicator is defined by a ratio of conditional probabilities of communication paths, the averaging may be performed on the basis of probability distribution, and where a reliability indicator is defined by a logarithmic likelihood ratio, integration may be used.

With such processing, since the reliability information generated from a plurality of reproduced signals is generated by computation processing based on stochastic computations, a plurality of reproduction energies can be used and the reduction in error rate unattainable with the conventional methods can be realized.

Further, in Embodiment 4, similarly to Embodiment 1, the column processing output value $\beta_{mn}$, which are the determination results of the previous cycle, are used as the initial value during decoding of the next cycle, but such a feature is not limiting and the configuration in which reliability is generated anew by computation processing based on stochastic computations can demonstrate the effect same as that obtained when a plurality of reproduction cycles are used.

Further, in Embodiment 4, the error correcting device 110 is provided with the second column processing output value storage memory 209, but the present invention is not limited to such a configuration. The error correcting device 110 in Embodiment 4 may be provided with the estimated word reliability storage memory 501 of Embodiments 2 and 3 and have no second column processing output value storage memory 209.

In Embodiment 4, the reliability generating device 301 may generate the new reliability information by using the generated reliability $\lambda_n$ and the column processing output value $\beta_{mn}$ saved in the second column processing output value storage memory 205.

Further, in Embodiments 1 to 4, it is possible to measure the time of the reproduction operation and end the decoding processing loop and cyclic reproduction processing when the measured reproduction time reaches a preset maximum time.

In Embodiments 1 to 4, the next decoding processing may be performed after saving only a predetermined amount of data in the reliability information sequence in the reliability storage memory 202 in order to reduce the rotation standby time of the optical disk.

In Embodiments 2 and 3, a method for generating the new estimated word reliability $L_n'$ is not limited to the above-described method, and for example where the reliability is binary information, the necessary memory volume can be reduced by using the results with the highest frequency.

Figure 16:
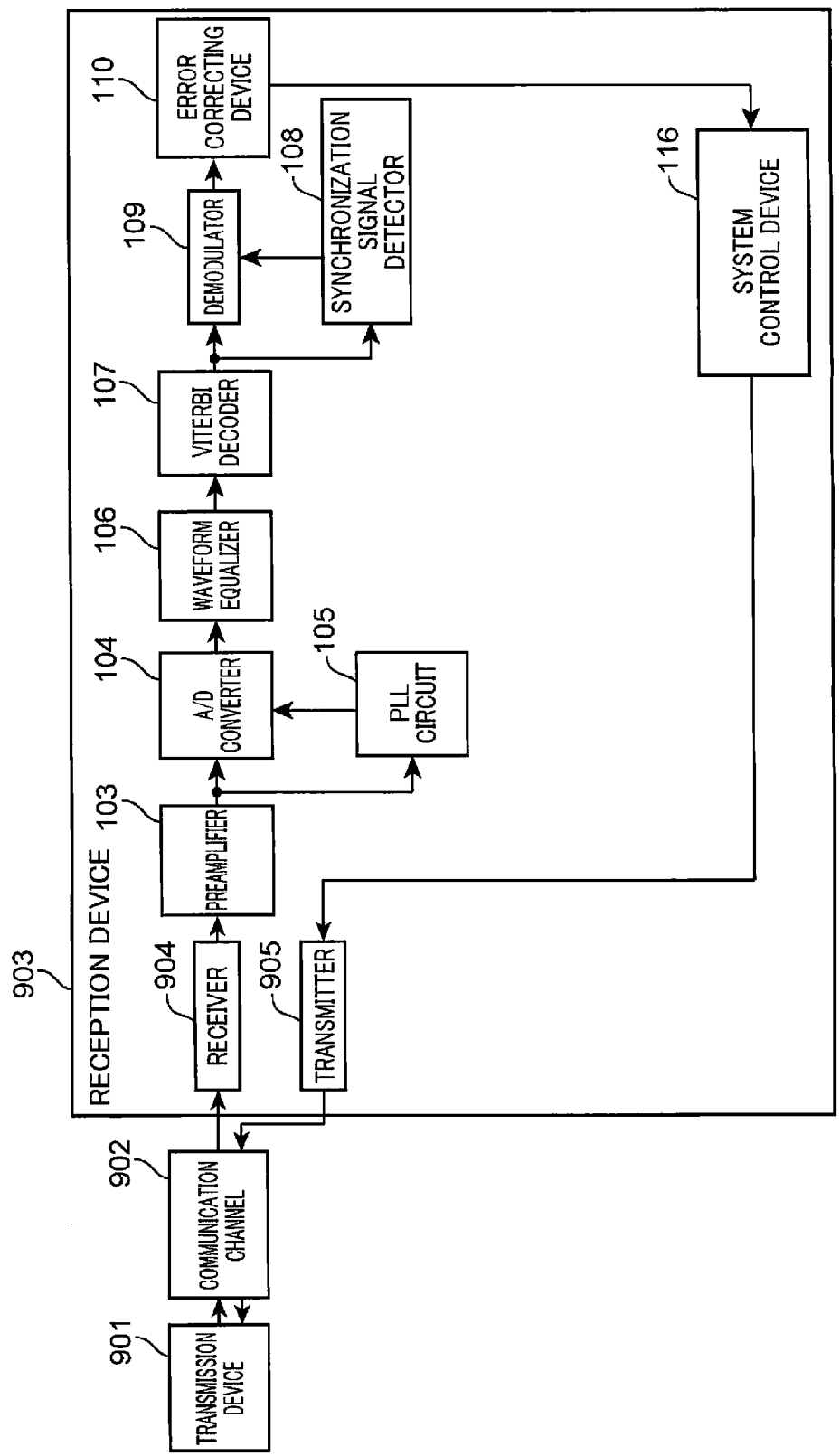
FIG. 16 shows the configuration of the information communication system according to Embodiments 1 to 4 of the present invention.
Figure 17:
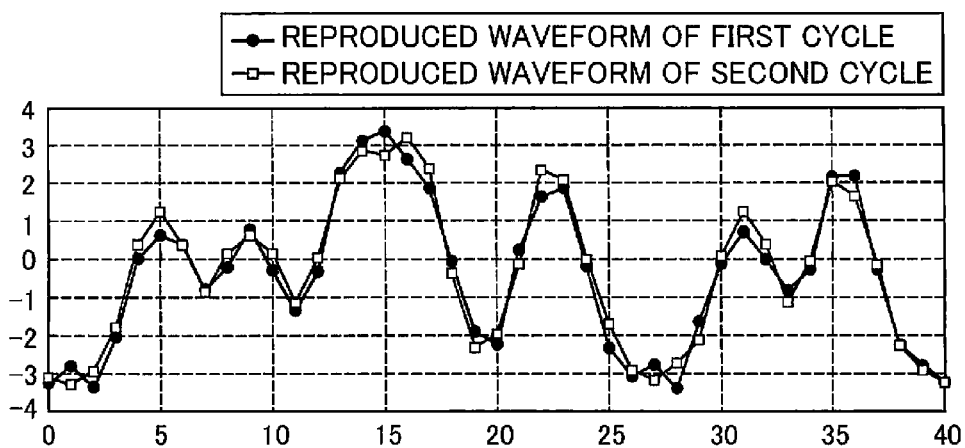
FIG. 17 shows an example of sampling data during normal operation.
Figure 18:
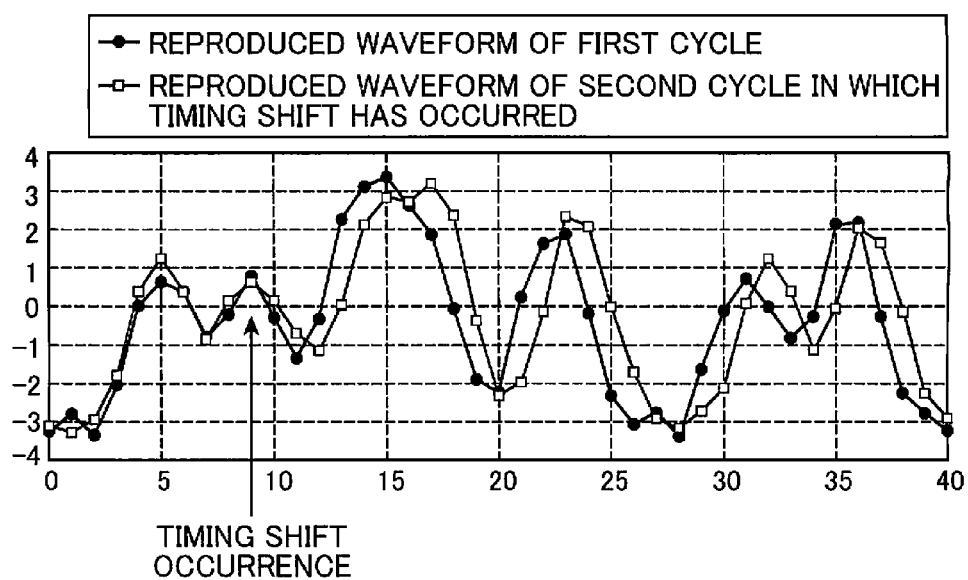
FIG. 18 shows an example of sampling data in the case where synchronization shift has occurred.

In Embodiments 1 to 4, the optical disk device reproducing information from an optical disk is described, but such a configuration is not limiting, and the decoding apparatus may be also used in the information communication system such as shown in FIG. 16.

FIG. 16 illustrates the configuration of the information communication system of Embodiments 1 to 4 of the present invention. The information communication system of FIG. 16 is provided with a transmission device 901, a communication channel 902, and a reception device 903. Communication information transmitted by the transmission device 901 is transmitted to the reception device 903 via the communication channel 902. The communication information as referred to herein is an electric signal or an optical signal.

The reception device 903 is provided with the preamplifier 103, A/D converter 104, PLL circuit 105, waveform equalizer 106, Viterbi decoder 107, synchronization signal detector 108, demodulator 109, error correcting device 110, system control device 116, a receiver 904, and a transmitter 905. In FIG. 16, the constituent elements same as those of the optical disk device of Embodiment 1 shown in FIG. 1 are assigned with like reference numerals and the explanation thereof is herein omitted.

The receiver 904 receives the communication information (data) transmitted by the transmission evince 901 and outputs the received information to the preamplifier 103.

When error correction is determined by the control device 211 (not shown in the figure) to be impossible with respect to the communication information transmitted by the transmission device 901, the transmitter 905 transmits a resend command to the transmission device 901 via the communication channel 902. Where the transmission device 901 receives the resend command, the transmission device transmits again the communication information on the data block same as that of the previous cycle. The reception device 903 performs a plurality of decoding processing operations according to the communication information of the previous cycle, as described in Embodiments 1 to 3. With the above-described configuration, a plurality of reproduction energies can be used and the reduction of error rate unattainable by the conventional methods can be also realized in the information communication system transmitting and receiving information.

The above-described specific embodiments mainly include the invention having the following features.

The decoding apparatus according to one aspect of the present invention is a decoding apparatus that receives input of data constituted by a plurality of data blocks and decodes the data on the basis of reliability information on the data encoded by a parity check matrix in the data blocks, the decoding apparatus including: a reliability generating device that generates the reliability information on the basis of the inputted data; a reliability storage memory that saves the reliability information; a row processing computation device that computes a row processing output value by performing row processing; a column processing computation device that computes a column processing output value by performing column processing, and a control device that inputs the reliability information on the same data block a plurality of times into the reliability storage memory, wherein the row processing computation device computes the row processing output value by performing row processing by using the column processing output value computed by the column processing computation device; the column processing computation device computes the column processing output value by performing column processing by using the row processing output value computed by the row processing output value and the reliability information generated by the reliability generating device; the reliability generating device generates anew reliability information by performing computation processing based on a stochastic computation by using reliability information generated in a previous cycle that has been saved in the reliability storage memory and reliability information generated in the present cycle, and saves the reliability information generated anew in the reliability storage memory when the decoding is performed by using reliability information on the data block same as that in the previous cycle; and the column processing computation device computes the column processing output value by using the reliability information generated anew and saved in the reliability storage memory and the row processing output value.

With such a configuration, the reliability generating device generates the reliability information on the basis of the inputted data. The reliability storage memory saves the reliability information. The row processing computation device computes the row processing output value by performing row processing. The column processing computation device computes the column processing output value by performing column processing. The control device inputs the reliability information on the same data block a plurality of times into the reliability storage memory. Further, the row processing computation device computes the row processing output value by performing row processing by using the column processing output value computed by the column processing computation device. The column processing computation device computes the column processing output value by performing column processing by using the row processing output value computed by the row processing output value and the reliability information generated by the reliability generating device. The reliability generating device generates anew reliability information by performing computation processing based on stochastic computations by using reliability information generated in the previous cycle that has been saved in the reliability storage memory and reliability information generated in the present cycle, and saves the reliability information generated anew in the reliability storage memory when the decoding is performed by using reliability information on the data block same as that in the previous cycle. The column processing computation device computes the column processing output value by using the reliability information generated anew and saved in the reliability storage memory and the row processing output value.

Therefore, decoding is performed a plurality of times by using reliability information on the same data block with respect to data with a high error rate prior to error correction. As a result, the error rate of the decoded data can be reduced and S/N can be increased.

It is preferred that the abovementioned decoding apparatus further include: a column processing output value storage memory that saves the column processing output value computed by the column processing computation device on the basis of the reliability information inputted in the previous cycle, wherein the row processing computation device uses the column processing output value of the previous cycle that have been saved in the column processing output value storage memory as initial value for the row processing when decoding using reliability information on a data block same as that in the previous cycle is performed.

With such a configuration, the column processing output value storage memory saves the column processing output value computed by the column processing computation device on the basis of the reliability information inputted in the previous cycle. The row processing computation device uses the column processing output value of the previous cycle that have been saved in the column processing output value storage memory as an initial value for the row processing when decoding using reliability information on a data block same as that in the previous cycle is performed.

Therefore, the column processing output value saved in the column processing output value storage memory represent the likelihood with respect to the reproduced data of the previous cycle. As a consequence, by using the column processing output value of the previous cycle, which have been saved in the column processing output value storage memory, as the initial value for the row processing and performing cyclic decoding with respect to the data different from those of the previous cycle, it is possible to use a plurality of reproduction energies and correct an error that could not be corrected during the reproduction of the previous cycle.

It is preferred that the abovementioned decoding apparatus further include: an estimated word generating device that generates an estimated word on the basis of the reliability information and the row processing output value; and an estimated word reliability storage memory that saves reliability of the estimated word, wherein the estimated word generating device updates reliability of the estimated word by using computation processing based on a stochastic computation on the basis of reliability of the estimated word of the previous cycle that has been saved in the estimated word reliability storage memory and reliability of the estimated word generated on the basis of reliability information inputted in the present cycle and the row processing output value, and generates the estimated word according to the updated reliability of the estimated word when decoding using reliability information on a data block same as that in the previous cycle is performed.

With such a configuration, the estimated word generating device generates an estimated word on the basis of the reliability information and the row processing output value. The estimated word reliability storage memory saves reliability of the estimated word. The estimated word generating device updates reliability of the estimated word by using computation processing based on stochastic computations on the basis of reliability of the estimated word of the previous cycle that has been saved in the estimated word reliability storage memory and reliability of the estimated word generated on the basis of reliability information inputted in the present cycle and the row processing output value, and generates the estimated word according to the updated reliability of the estimated word when decoding using reliability information on a data block same as that in the previous cycle is performed.

Therefore, since the estimated word reliability is updated by using computation processing based on stochastic computations on the basis of reliability of the estimated word of the previous cycle and reliability of the estimated word generated on the basis of reliability information inputted in the present cycle and the row processing output value with respect to a data block having data with a high error rate, the error rate of the decoded data can be reduced and S/N can be increased.

It is preferred that in the abovementioned decoding apparatus, the row processing computation device repeatedly compute the row processing output value by using the column processing output value computed by the column processing computation device; and the control device monitor the number of computation processing cycles of the row processing output value performed by the row processing computation device and, when the number of computation processing cycles reaches a predetermined number of cycles, inputs the reliability information on a data block same as that in the previous cycle into the reliability storage memory.

With such a configuration, the row processing computation device repeatedly computes the row processing output value by using the column processing output value computed by the column processing computation device. The control device monitors the number of computation processing cycles of the row processing output value performed by the row processing computation device and, when the number of computation processing cycles reaches a predetermined number of cycles, inputs the reliability information on a data block same as that in the previous cycle into the reliability storage memory.

Therefore, when the number of computation processing cycles reaches the predetermined number of cycles, the reliability information on a data block same as that in the previous cycle is inputted into the reliability storage memory. As a result, the increase in the unnecessary computation processing time with respect to data with a high noise level and poor convergence can be prevented.

It is preferred that the abovementioned decoding apparatus further include a decoding result determination device that determines a decoding result, wherein the control device performs decoding processing again by using the reliability information saved in the reliability storage memory with respect to a data block for which the determination result obtained by the decoding result determination device does not fulfill a predetermined condition.

With such a configuration, the decoding processing is performed again by using the reliability information saved in the reliability storage memory with respect to a data block for which the determination result obtained by the decoding result determination device does not fulfill the predetermined condition. Therefore, it is possible to determine whether or not to perform the decoding processing again according to the decoding result.

It is also preferred that the abovementioned decoding apparatus further include an estimated word generating device that generates an estimated word on the basis of the reliability information and the row processing output value; and a parity checking device that checks whether the estimated word generated on the basis of the reliability information and the row processing output value has been decoded correctly, wherein the control device performs decoding processing again by using the reliability information saved in the reliability storage memory with respect to a data block for which the checking result obtained by the parity checking device does not fulfill a predetermined condition.

With such a configuration, the estimated word generating device generates an estimated word on the basis of the reliability information and the row processing output value. The parity checking device checks whether the estimated word generated on the basis of the reliability information and the row processing output value has been decoded correctly. The control device performs decoding processing again by using the reliability information saved in the reliability storage memory with respect to a data block for which the checking result obtained by the parity checking device does not fulfill a predetermined condition.

Therefore, the parity checking device can check whether the estimated word has been decoded correctly, and it is possible to determine whether or not to perform the decoding processing again according to the decoding result.

It is also preferred that the abovementioned decoding apparatus further include: an estimated word generating device that generates an estimated word on the basis of the reliability information and the row processing output value; and a decoding result determination device that determines a decoding result by comparing a computation result from any of the column processing output value, the row processing output value, and the estimated word reliability with a predetermined threshold, wherein the control device performs decoding processing again by using the reliability information saved in the reliability storage memory with respect to a data block for which the determination result obtained by the decoding result determination device does not fulfill the predetermined condition.

With such a configuration, the estimated word generating device generates an estimated word on the basis of the reliability information and the row processing output value. The decoding result determination device determines a decoding result by comparing any one computation result from among the column processing output value, the row processing output value, and the estimated word reliability with a predetermined threshold. The control device performs decoding processing again by using the reliability information saved in the reliability storage memory with respect to a data block for which the determination result obtained by the decoding result determination device does not fulfill the predetermined condition.

Therefore, the decoding result can be determined by comparing any one computation result from among the column processing output value, row processing output value, and estimated word reliability with a predetermined threshold, and it is possible to determine whether or not to perform the decoding processing again according to the decoding result.

It is also preferred that the abovementioned decoding apparatus further include an estimated word generating device that generates an estimated word on the basis of the reliability information and the row processing output value, wherein the estimated word generating device generates an estimated word according to the updated reliability of the estimated word when the reliability of the estimated word is saved in the estimated word reliability storage memory.

With such a configuration, an estimated word is generated according to the updated reliability of the estimated word when the reliability of the estimated word is saved in the estimated word reliability storage memory. Therefore, the error rate of the decoded data can be reduced and S/N can be increased.

The decoding apparatus according to another aspect of the present invention is a decoding apparatus that receives input of data constituted by a plurality of data blocks and decodes the data on the basis of reliability information on the data encoded by a parity check matrix in the data blocks, the decoding apparatus including: a reliability storage memory that saves the reliability information; a row processing computation device that computes a row processing output value by performing row processing; a column processing computation device that computes a column processing output value by performing column processing; a column processing output value storage memory that saves the column processing output value; and a control device that inputs the reliability information on the same data block a plurality of times into the reliability storage memory, wherein the row processing computation device computes the row processing output value by performing row processing by using the column processing output value computed by the column processing computation device; the column processing computation device computes the column processing output value by performing column processing by using the row processing output value computed by the row processing output value and the reliability information generated by the reliability generating device; the column processing output value storage memory saves the column processing output value computed by the column processing computation device on the basis of the reliability information inputted in the previous cycle; and the row processing computation device uses the column processing output value of the previous cycle, which have been saved in the column processing output value storage memory, as initial value for the row processing, when decoding using reliability information on a data block same as that of the previous cycle is performed.

With such a configuration, the reliability storage memory saves the reliability information. The row processing computation device computes the row processing output value by performing row processing. The column processing computation device computes the column processing output value by performing column processing. The column processing output value storage memory saves the column processing output value. The control device inputs the reliability information on the same data block a plurality of times into the reliability storage memory. The row processing computation device computes the row processing output value by performing row processing by using the column processing output value computed by the column processing computation device. The column processing computation device computes the column processing output value by performing column processing by using the row processing output value computed by the row processing output value and the reliability information generated by the reliability generating device. The column processing output value storage memory saves the column processing output value computed by the column processing computation device on the basis of the reliability information inputted in the previous cycle. The row processing computation device uses the column processing output value of the previous cycle, which have been saved in the column processing output value storage memory, as initial value for the row processing when decoding using reliability information on a data block same as that of the previous cycle is performed.

Therefore, decoding is performed a plurality of times by using reliability information on the same data block with respect to data with a high error rate prior to error correction. As a result, the error rate of the decoded data can be reduced and S/N can be increased. Further, the column processing output value saved in the column processing output storage memory represent the likelihood with respect to the reproduced data of the previous cycle. Therefore, by taking the column processing output value of the previous cycle, which have been saved in the column processing output value storage memory, as initial value for the row processing and performing repeated decoding with respect to data different from those of the previous cycle, it is possible to use a plurality of reproduction energies and correct an error that could not be corrected during the reproduction of the previous cycle.

The decoding apparatus according to another aspect of the present invention is a decoding apparatus that receives input of data constituted by a plurality of data blocks and decodes the data on the basis of reliability information on the data encoded by a parity check matrix in the data blocks, the decoding apparatus including: a reliability storage memory that saves the reliability information; a row processing computation device that computes a row processing output value by performing row processing; a column processing computation device that computes a column processing output value by performing column processing; an estimated word generating device that generates an estimated word on the basis of the reliability information and the row processing output value; an estimated word reliability storage memory that saves reliability of the estimated word; and a control device that inputs the reliability information on the same data block a plurality of times into the reliability storage memory, wherein the row processing computation device computes the row processing output value by performing row processing by using the column processing output value computed by the column processing computation device; the column processing computation device computes the column processing output value by performing column processing by using the row processing output value computed by the row processing output value and the reliability information generated by the reliability generating device; and the estimated word generating device updates the estimated word reliability by using computation processing based on a stochastic computation on the basis of the estimated word reliability of the previous cycle that has been saved in the estimated word reliability storage memory and the estimated word reliability generated on the basis of reliability information inputted in the present cycle and the row processing output value, and generates the estimated word according to the updated estimated word reliability when decoding using reliability information on a data block same as that in the previous cycle is performed.

With such a configuration, the reliability storage memory saves the reliability information. The row processing computation device computes the row processing output value by performing row processing. The column processing computation device computes the column processing output value by performing column processing. The estimated word generating device generates an estimated word on the basis of the reliability information and the row processing output value; an estimated word reliability storage memory that saves reliability of the estimated word. The estimated word reliability storage memory saves reliability of the estimated word. The control device inputs the reliability information on the same data block a plurality of times into the reliability storage memory. Further, the row processing computation device computes the row processing output value by performing row processing by using the column processing output value computed by the column processing computation device. The column processing computation device computes the column processing output value by performing column processing by using the row processing output value computed by the row processing output value and the reliability information generated by the reliability generating device. The estimated word generating device updates the estimated word reliability by using computation processing based on stochastic computations on the basis of the estimated word reliability of the previous cycle that has been saved in the estimated word reliability storage memory and the estimated word reliability generated on the basis of reliability information inputted in the present cycle and the row processing output value, and generates the estimated word according to the updated estimated word reliability when decoding using reliability information on a data block same as that in the previous cycle is performed.

Therefore, since the estimated word reliability is updated by using computation processing based on stochastic computations on the basis of reliability of the estimated word of the previous cycle and reliability of the estimated word generated on the basis of reliability information inputted in the present cycle and the row processing output value with respect to a data block having data with a high error rate, the error rate of the decoded data can be reduced and S/N can be increased.

The decoding apparatus according to another aspect of the present invention is a decoding apparatus that receives input of data constituted by a plurality of data blocks and decodes the data on the basis of reliability information on the data encoded by a parity check matrix in the data blocks, the decoding apparatus including: a memory that saves at least one from among the reliability information generated on the basis of the inputted data, a column processing output value computed by performing column processing, and reliability of an estimated word generated on the basis of reliability information and a row processing output value; and a decoding processing unit that performs predetermined decoding processing a plurality of times with respect to the reliability information on the same data block by using at least one from among the reliability information, the column processing output value, and reliability of the estimated word.

With such a configuration, the memory saves at least one from among the reliability information generated on the basis of the inputted data, the column processing output value computed by performing column processing, and reliability of an estimated word generated on the basis of reliability information and the row processing output value. The decoding processing unit performs predetermined decoding processing a plurality of times with respect to the reliability information on the same data block by using at least one from among the reliability information, the column processing output value, and reliability of the estimated word.

Therefore, the predetermined decoding processing is performed a plurality of times with respect to the reliability information on the same data block by using at least one from among reliability information, column processing output value, and reliability of the estimated word with respect to data for which a synchronization shift has been corrected by a demodulator. As a result, the synchronization shift can be inhibited and S/N of the decoded data can be increased.

The decoding method according to yet another aspect of the present invention is a decoding method in which data constituted by a plurality of data blocks are inputted and the data are decoded on the basis of reliability information on the data encoded by a parity check matrix in the data blocks, the decoding method including: a reliability generation step of generating the reliability information on the basis of the inputted data; a reliability storage step of saving the reliability information in a reliability storage memory; a row processing computation step of computing a row processing output value by performing row processing; a column processing computation step of computing a column processing output value by performing column processing, and a control step of inputting the reliability information on the same data block a plurality of times into the reliability storage memory, wherein the row processing computation step includes computing the row processing output value by performing row processing by using the column processing output value computed in the column processing computation step; the column processing computation step includes computing the column processing output value by performing column processing by using the row processing output value computed in the row processing output step and the reliability information generated in the reliability generation step; the reliability generation step includes generating anew reliability information by performing computation processing based on a stochastic computation by using reliability information generated in the previous cycle that has been saved in the reliability storage memory and reliability information generated in the present cycle, and saving the reliability information generated anew in the reliability storage memory when the decoding is performed by using reliability information on the data block same as that in the previous cycle; and the column processing computation step includes computing the column processing output value by using the reliability information generated anew and saved in the reliability storage memory and the row processing output value.

With such a configuration, in the reliability generation step, the reliability information is generated on the basis of the inputted data. In the reliability storage step, the reliability information is saved in a reliability storage memory. In the row processing computation step, the row processing output value is computed by performing row processing. In the column processing computation step, the column processing output value is computed by performing column processing. In the control step, the reliability information on the same data block is inputted a plurality of times into the reliability storage memory. Further, the row processing computation step includes computing the row processing output value by performing row processing by using the column processing output value computed in the column processing computation step. The column processing computation step includes computing the column processing output value by performing column processing by using the row processing output value computed in the row processing output step and the reliability information generated in the reliability generation step. The reliability generation step includes generating anew reliability information by performing computation processing based on a stochastic computation by using reliability information generated in the previous cycle that has been saved in the reliability storage memory and reliability information generated in the present cycle, and saving the reliability information generated anew in the reliability storage memory when the decoding is performed by using reliability information on the data block same as that in the previous cycle. The column processing computation step includes computing the column processing output value by using the reliability information generated anew and saved in the reliability storage memory and the row processing output value.

Therefore, decoding is performed a plurality of times by using reliability information on the same data block with respect to data with a high error rate prior to error correction. As a result, the error rate of the decoded data can be reduced and S/N can be increased.

Specific embodiments or examples present in the section illustrating the Description of Embodiments are merely used to clarify the technical contents of the present invention, and the present invention should not be construed narrowly as being limited to those specific examples. Thus various modifications can be made without departing from the essence and scope of the present invention defined by the claims.

The decoding apparatus and decoding method in accordance with the present invention are suitable for decoding data by using a plurality of reproduced signals and useful for increasing the recording density of recording media and increasing the feasibility of the entire system. Further, the present invention is also applicable to decoding apparatuses and decoding methods using high-capacity optical disks and can be also applied to digital communication devices and methods and also to integrated circuits.

The invention claimed is:

1. A decoding apparatus that decodes data on the basis of reliability information on the data encoded in accordance with a parity check matrix, the decoding apparatus comprising:
a reliability generating device that generates first reliability information corresponding to first detection processing relating to the data;
a reliability storage memory that saves first reliability information;
a row processing computation device that computes a row processing output value by performing row processing;
a column processing computation device that computes a column processing output value by performing column processing; and
an estimated word generating device that generates a first estimated word on the basis of the first reliability information and the row processing output value, and outputs the generated first estimated word as decoded data, wherein
the row processing computation device computes a first row processing output value by performing row processing by using an initial value of the column processing output value,
the column processing computation device computes a first column processing output value by performing column processing by using the first row processing output value computed by the row processing computation device and the first reliability information generated by the reliability generating device,
the reliability generating device generates second reliability information corresponding to second detection processing relating to the data same as that of the first detection processing, generates third reliability information by performing computation processing based on a stochastic computation by using the first reliability information and the second reliability information, and saves the generated third reliability information in the reliability storage memory,
the row processing computation device computes a second row processing output value by performing row processing by using the first column processing output value computed by the column processing computation device,
the column processing computation device computes a second column processing output value by performing column processing by using the second row processing output value computed by the row processing computation device and the third reliability information saved in the reliability storage memory, and
the estimated word generating device generates a second estimated word on the basis of the third reliability information and the second row processing output value, and outputs the generated second estimated word as decoded data.

2. The decoding apparatus according to claim 1, further comprising a column processing output value storage memory that saves the first column processing output value, wherein
the row processing computation device computes the second row processing output value by performing row processing by using the first column processing output value that have been saved in the column processing output value storage memory.

3. The decoding apparatus according to claim 1, wherein
the estimated word generating device generates a reliability value of the first estimated word and a reliability value of the second estimated word,
the decoding apparatus further comprising:
an estimated word reliability storage memory that saves the reliability value of the first estimated word generated by the estimated word generating device, wherein
the estimated word generating device updates the reliability value of the first estimated word by using computation processing based on a stochastic computation on the basis of the reliability value of the first estimated word saved in the estimated word reliability storage memory and the reliability value of the second estimated word generated by the estimated word generating device, and generates a third estimated word according to the updated reliability value.

4. The decoding apparatus according to claim 3, further comprising:
a control device that controls the saving the first and the third reliability information into the reliability storage memory; and
a decoding result determination device that determines whether the first estimated word is decoded correctly by comparing of the first column processing output value, the first row processing output value, and the reliability value of the first estimated word reliability with a predetermined threshold, wherein
the control device instructs the reliability generating device to generate the third reliability information and save the generated third reliability information in the reliability storage memory when a determination result obtained by the decoding result determination device does not fulfill the predetermined condition.

5. The decoding apparatus according to claim 3, wherein
the estimated word generating device generates the third estimated word according to the updated reliability value when the reliability value of the first estimated word is saved in the estimated word reliability storage memory.

6. The decoding apparatus according to claim 1, further comprising a control device that controls the saving the first and the third reliability information into the reliability storage memory, wherein
the row processing computation device repeatedly computes the row processing output value by using the column processing output value computed by the column processing computation device; and
the control device monitors the number of computation processing cycles of the row processing output value performed by the row processing computation device and, when the number of computation processing cycles reaches a predetermined number of cycles, inputs the second reliability information the reliability storage memory.

7. The decoding apparatus according to claim 1, further comprising:
a control device that controls the saving the first and the third reliability information into the reliability storage memory; and
a decoding result determination device that determines whether the first estimated word is decoded correctly, wherein
the control device instructs the reliability generating device to generate the third reliability information and save the generated third reliability information in the reliability storage memory when a determination result obtained by the decoding result determination device does not fulfill a predetermined condition.

8. The decoding apparatus according to claim 1, further comprising:
a control device that controls the saving the first and the third reliability information into the reliability storage memory; and
a parity checking device that checks whether the first estimated word has been decoded correctly, wherein
the control device instructs the reliability generating device to generate the third reliability information and save the generated third reliability information in the reliability storage memory when a checking result obtained by the parity checking device does not fulfill a predetermined condition.

9. A decoding apparatus that decodes data on the basis of reliability information on the data encoded in accordance with a parity check matrix,
the decoding apparatus comprising:
a reliability generating device that generates first reliability information corresponding to first detection processing relating to the data;
a reliability storage memory that saves first reliability information;
a row processing computation device that computes a row processing output value by performing row processing;
a column processing computation device that computes a column processing output value by performing column processing;
a column processing output value storage memory that saves the column processing output value; and
an estimated word generating device that generates a first estimated word on the basis of the first reliability information and the row processing output value, and outputs the generated first estimated word as decoded data, wherein
the row processing computation device computes a first row processing output value by performing row processing by using an initial value of the column processing output value,
the column processing computation device computes a first column processing output value by performing column processing by using the first row processing output value computed by the row processing computation device and the first reliability information saved in the reliability storage memory,
the column processing output value storage memory saves the first column processing output value computed by the column processing computation device,
the reliability generating device generates second reliability information corresponding to second detection processing relating to the data same as that of the first detection processing, and saves the generated second reliability information in the reliability storage memory, and
the row processing computation device computes a second row processing output value by performing row processing by using the first column processing output value saved in the column processing output value storage memory.

10. A decoding apparatus that decodes data on the basis of reliability information on the data encoded in accordance with a parity check matrix,
the decoding apparatus comprising:
a reliability generating device that generates first reliability information corresponding to first detection processing relating to the data;
a reliability storage memory that saves the first reliability information;
a row processing computation device that computes a row processing output value by performing row processing;
a column processing computation device that computes a column processing output value by performing column processing;
an estimated word generating device that generates a first estimated word on the basis of the first reliability information and the row processing output value, and outputs the generated first estimated data as decoded data; and
an estimated word reliability storage memory that saves a reliability value of the first estimated word generated by the estimated word generating device, wherein
the row processing computation device computes a first row processing output value by performing row processing by using an initial value of the column processing output value,
the column processing computation device computes a first column processing output value by performing column processing by using the first row processing output value computed by the row processing computation device and the first reliability information saved in the reliability storage memory,
the reliability generating device generates second reliability information corresponding to second detection processing relating to the data that is the same as that of the first detecting processing after the first estimated word is generated by using the first reliability information corresponding to the first detection processing,
the reliability storage memory saves the generated second reliability information,
the row processing computation device computes a second row processing output value by performing row processing by using the first column processing output value computed by the column processing computation device,
the column processing computation device computes a second column processing value by performing column processing by using the second row processing output value computed by the row processing computation device and the second reliability information saved in the reliability storage memory, and
the estimated word generating device generates a second estimated word and updates the reliability value of the first estimated word by using computation processing based on a stochastic computation on the basis of the reliability value of the first estimated word saved in the estimated word reliability storage memory and a reliability value of the second estimated word generated on the basis of the second reliability information and the second row processing output value, and generates a third estimated word according to the updated reliability word value when the second detection processing is performed.

11. A decoding apparatus that decodes data on the basis of reliability information on the data encoded in accordance with a parity check matrix,
the decoding apparatus comprising:
a reliability generating device that generates first reliability information corresponding to first detection processing relating to the data, and second reliability information corresponding to second detection processing relating to the data same as that of the first detection processing;
a memory that saves at least one from among the first reliability information, the second reliability information, a column processing output value computed by performing column processing, a reliability value of a first estimated word generated on the basis of the first reliability information and a row processing output value, and a reliability value of a second estimated word generated on the basis of the second reliability information and the row processing output value; and a decoding processing unit that performs decoding processing of the first reliability information and decoding processing of the second reliability information by using at least one of the first reliability information, the second reliability information, the column processing output value, the reliability value of the first estimated word, and the reliability value of the second estimated word which are saved in the memory.

12. A decoding method that decodes data on the basis of reliability information on the data encoded in accordance with a parity check matrix, the decoding method comprising:

a reliability generation step of generating the first reliability information corresponding to first detection processing relating to the data;

a reliability storage step of saving the first reliability information in a reliability storage memory;

a row processing computation step of computing a row processing output value by performing row processing;

a column processing computation step of computing a column processing output value by performing column processing; and an estimated word generation step of generating a first estimated word on the basis of the first reliability information and the row processing output value, and outputting the generated first estimated word as decoded data, wherein the row processing computation step includes computing a first row processing output value by performing row processing by using an initial value of the column processing output value;

the column processing computation step includes computing a first column processing output value by performing column processing by using the first row processing output value computed in the row processing computation step and the first reliability information generated in the reliability generation step;

the reliability generation step includes generating second reliability information corresponding to second detection processing relating to the data same as that of the first detection processing, generating third reliability information by performing computation processing based on a stochastic computation by using the first reliability information and the second reliability information, and then saving the generated third reliability information in the reliability storage memory, the row processing computation step includes computing a second row processing output value by performing row processing by using the first column processing output value computed in the column processing computation step, the column processing computation step includes computing a second column processing output value by performing column processing by using the second row processing output value computed in the row processing computation step and the third reliability information saved in the reliability storage memory, and the estimated word generation step includes generating a second estimated word on the basis of the third reliability information and the second row processing output value, and outputs the generated second estimated word as decoded data.

* * * * *